(12) United States Patent
Matsudo et al.

(10) Patent No.: US 11,990,420 B2
(45) Date of Patent: May 21, 2024

(54) ELECTROMAGNETIC WAVE SHIELDING SHEET

(71) Applicants: artience Co., Ltd., Tokyo (JP); TOYOCHEM CO., LTD., Tokyo (JP)

(72) Inventors: Kazunori Matsudo, Tokyo (JP); Ryota Umezawa, Tokyo (JP); Kenji Ando, Tokyo (JP); Tsutomu Hayasaka, Tokyo (JP)

(73) Assignees: ARTIENCE CO., LTD., Tokyo (JP); TOYOCHEM CO., LTD., Tokyo (JP)

( * ) Notice: Subject to any disclaimer, the term of this patent is extended or adjusted under 35 U.S.C. 154(b) by 706 days.

(21) Appl. No.: 16/972,759

(22) PCT Filed: Apr. 15, 2019

(86) PCT No.: PCT/JP2019/016185
§ 371 (c)(1),
(2) Date: Dec. 7, 2020

(87) PCT Pub. No.: WO2019/239710
PCT Pub. Date: Dec. 19, 2019

(65) Prior Publication Data
US 2021/0242137 A1    Aug. 5, 2021

(30) Foreign Application Priority Data
Jun. 12, 2018  (JP) .................................. 2018-111856

(51) Int. Cl.
*H01L 23/00* (2006.01)
*H01L 23/31* (2006.01)
(Continued)

(52) U.S. Cl.
CPC ............ *H01L 23/552* (2013.01); *H01L 23/31* (2013.01); *H05K 9/0045* (2013.01); *H05K 9/0081* (2013.01)

(58) Field of Classification Search
CPC ..... H01L 23/552; H01L 23/31; H01L 21/561; H01L 21/56; H01L 21/565;
(Continued)

(56) References Cited

U.S. PATENT DOCUMENTS 10,512,200 B1 * 12/2019 Machinaga ............... B32B 7/02
2010/0196703 A1    8/2010 Matsuura et al.
(Continued)

FOREIGN PATENT DOCUMENTS

CN    101451050 A    6/2009
CN    104284571 A    1/2015
(Continued)

OTHER PUBLICATIONS

Office Action issued on Oct. 2, 2018 in corresponding Japanese application No. 2018-111856; 10 pages including Machine-generated English-language translation.
(Continued)

*Primary Examiner* — Nikolay K Yushin
(74) *Attorney, Agent, or Firm* — Maier & Maier, PLLC

(57) ABSTRACT

An electromagnetic wave shielding sheet according to the present embodiments is an electromagnetic wave shielding sheet for forming an electromagnetic wave shielding layer used for a component-mounting substrate including a substrate, an electronic component and an electromagnetic wave shielding layer, in which the electromagnetic wave shielding sheet includes at least one of a conductive layer before thermal pressing of the electromagnetic wave reflection layer and a conductive layer before thermal pressing of the electromagnetic wave absorption layer, the conductive layer before thermal pressing of the electromagnetic wave reflection layer includes a binder resin and a conductive filler, and the conductive layer before thermal pressing of the electromagnetic wave absorption layer includes a binder
(Continued)

resin and an electromagnetic wave absorption filler. The Young's modulus of the conductive layer at 23° C. is set to 10 to 700 MPa.

5 Claims, 16 Drawing Sheets

(51) Int. Cl.
*H01L 23/552* (2006.01)
*H05K 9/00* (2006.01)

(58) Field of Classification Search
CPC . H01L 2224/48227; H01L 2924/15159; H01L 2924/15311; H01L 23/3128; H01L 2924/3025; H01L 2924/179; H05K 9/0045; H05K 9/0081; H05K 9/0031; H05K 9/0071; H05K 1/02; H05K 1/0201; H05K 1/0242; H05K 1/0218; H05K 9/0083; H05K 9/0088; H05K 9/007; H05K 9/00; H05K 9/0084
See application file for complete search history.

(56) References Cited

U.S. PATENT DOCUMENTS

| | | | |
|---|---|---|---|
| 2015/0009637 A1 | 1/2015 | Kawaguchi | |
| 2015/0129174 A1 | 5/2015 | Monson et al. | |
| 2017/0031092 A1 | 2/2017 | Sohma et al. | |
| 2017/0278804 A1* | 9/2017 | Kawabata | H01L 23/552 |
| 2019/0380232 A1* | 12/2019 | Machinaga | B32B 7/02 |

FOREIGN PATENT DOCUMENTS

| | | | |
|---|---|---|---|
| JP | H03-053152 | A | 3/1991 |
| JP | 2742450 | B2 | 4/1998 |
| JP | 2001-031943 | A | 2/2001 |
| JP | 2003193016 | A | 7/2003 |
| JP | 2013-145790 | A | 7/2013 |
| JP | 2013-149871 | A | 8/2013 |
| JP | 2014-057041 | A | 3/2014 |
| JP | 2014-057043 | A | 3/2014 |
| JP | 2014-110263 | A | 6/2014 |
| JP | 2015015304 | A | 1/2015 |
| JP | 2015-219271 | A | 12/2015 |
| JP | 2017092417 | A | 5/2017 |
| JP | 2018-006536 | A | 1/2018 |
| WO | 2008/133293 | A1 | 11/2008 |
| WO | 2014/027673 | A1 | 2/2014 |
| WO | 2014/083875 | A1 | 6/2014 |
| WO | 2015/186624 | A1 | 12/2015 |

OTHER PUBLICATIONS

Office Action issued on Feb. 12, 2019 in corresponding Japanese application No. 2018-111856; 10 pages including Machine-generated English-language translation.
International Search Report issued on Jul. 2, 2019 in corresponding International application No. PCT/JP2019/016185; 2 pages.
Chinese Office Action issued on May 11, 2021, in connection with corresponding CN Application No. 201980036303.X (13 pp., including machine-generated English translation).
Korean Office Action issued on Apr. 20, 2021, in connection with corresponding KR Application No. 10-2020-7036280 (8 pp., including machine-generated English translation).
Chinese Office Action issued on Sep. 17, 2021, in connection with corresponding CN Application No. 201980036303.X (15 pp., including machine-generated English translation).

* cited by examiner

COMPONENT-MOUNTING SUBSTRATE
ACCORDING TO COMPARATIVE EXAMPLE 1
COMPONENT-MOUNTING
SUBSTRATE ACCORDING TO EXAMPLE 4
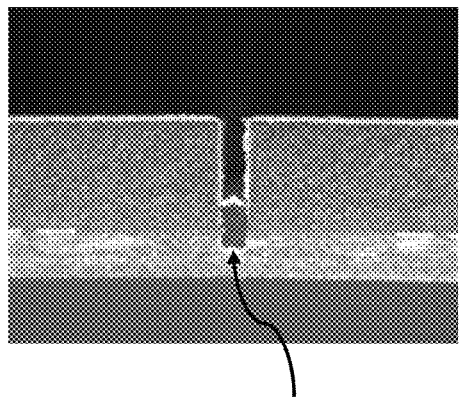
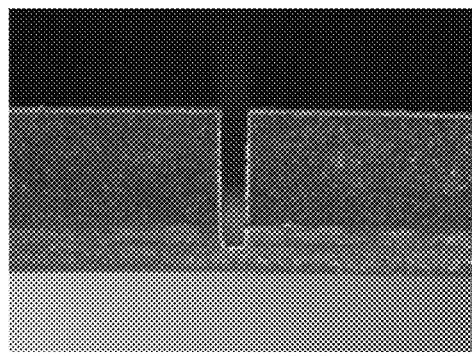
POOR EMBEDDING PROPERTIES
Fig. 14

FILM BREAKS INSIDE GROOVES

ELECTROMAGNETIC WAVE SHIELDING SHEET

FIELD

The present disclosure relates to an electromagnetic wave shielding sheet that is preferable for forming an electromagnetic wave shielding layer of a component-mounting substrate.

BACKGROUND

An electronic substrate on which electronic components such as IC chips are mounted is typically provided with an electromagnetic wave shielding structure in order to prevent a malfunction due to external magnetic field or radio waves and to reduce unwanted radiation of electric signals generated from the inside of the electronic substrate. Although a sputtering method has been employed for shielding IC chips, an alternative technology has been required due to a problem of investment in equipment etc.

In order to satisfy the above demand, a method of coating a mold resin that forms an outer skeleton of an electronic component with an electromagnetic wave shielding sheet has been recently proposed (see International Patent Publication No. WO 2014/083875, International Patent Publication No. WO 2014/027673, International Patent Publication No. WO 2015/186624).

SUMMARY

International Patent Publication No. WO 2014/083875, International Patent Publication No. WO 2014/027673, International Patent Publication No. WO 2015/186624 disclose a technique of forming an electromagnetic wave shielding layer on surfaces of electronic components by thermally pressing an electromagnetic wave shielding sheet. In International Patent Publication No. WO 2015/186624, for example, a substrate on which electronic components that form a sealing resin are mounted is subjected to half dicing, and an electromagnetic wave shielding sheet is thermally pressed on the concave/convex surfaces of the above substrate. Since the edges of the convex parts formed by half dicing have an acute angle, as shown in FIG. 16, when the electromagnetic wave shielding sheet is thermally pressed, the electromagnetic wave shielding sheet is easily broken in the edge parts (e.g., A-1 and A-2 in FIG. 16) thereof. This causes a problem that not only the external appearance is deteriorated but also the quality of the electromagnetic wave shielding layer is reduced (hereinafter referred to as edge covering properties). On the other hand, if the hardness level of the film of the electromagnetic wave shielding sheet is improved in order to prevent the edge parts thereof from being broken, a property by which the electromagnetic wave shielding sheet is embedded into the concave parts is degraded as shown in FIG. 17 or the electromagnetic wave shielding sheet is broken in groove parts as shown in FIG. 18, which causes a problem, for example, that the electromagnetic wave shielding sheet cannot be connected to ground parts provided on side surfaces of the groove parts of the substrate (hereinafter referred to as ground connectivity).

In addition, since electronic components are required to have long-term weather resistance, it is absolutely necessary that they withstand a Pressure Cooker Test (PCT resistance). There is a problem, however, that it is extremely difficult to impart PCT resistance while imparting flexibility to the electromagnetic wave shielding sheet in such a way that it fills the grooves between the electronic components.

The present disclosure has been made in view of the aforementioned circumstances and aims to provide an electromagnetic wave shielding sheet capable of providing an electromagnetic wave shielding layer having high embedding properties, ground connectivity, edge covering properties, and PCT resistance.

As a result of our thorough research, the present inventors have found that the problem of the present disclosure may be solved in terms of the following aspects and have completed the present disclosure.

[1]: An electromagnetic wave shielding sheet before thermal pressing for forming an electromagnetic wave shielding layer used for an electronic component-mounting substrate including:
  a substrate;
  an electronic component mounted on one or both surfaces of the substrate; and
  an electromagnetic wave shielding layer that covers a step part formed by mounting the electronic component and at least a part of an exposed surface of the substrate and includes at least one of an electromagnetic wave reflection layer and an electromagnetic wave absorption layer, in which
  the electromagnetic wave shielding sheet includes at least one of a conductive layer before thermal pressing of the electromagnetic wave reflection layer and a conductive layer before thermal pressing of the electromagnetic wave absorption layer,
  the conductive layer before thermal pressing of the electromagnetic wave reflection layer includes a binder resin and a conductive filler,
  the conductive layer before thermal pressing of the electromagnetic wave absorption layer includes a binder resin and an electromagnetic wave absorption filler, and
  the Young's modulus of the conductive layer at 23° C. is 10 to 700 MPa.

[2]: The electromagnetic wave shielding sheet according to [1], in which the Young's modulus of the conductive layer at 80° C. is 5 to 85 MPa.

[3]: The electromagnetic wave shielding sheet according to [1] or [2], in which the glass transition temperature [Tg] of the conductive layer is −15° C. to 30° C., and the glass transition temperature [Tg] after the conductive layer is heated at 180° C. for two hours is 20 to 80° C.

[4]: The electromagnetic wave shielding sheet according to any one of [1]-[3], in which the ratio [Young's modulus at 23° C.]/[Young's modulus at 80° C.] is 1.8 to 8.5.

[5]: The electromagnetic wave shielding sheet according to any one of [1]-[4], in which the curing degree of the conductive layer is 60 to 99%.

According to the present disclosure, it is possible to provide an electromagnetic wave shielding sheet that forms an electromagnetic wave shielding layer with high embedding properties, ground connectivity, edge covering properties, and PCT resistance. It is therefore possible to provide a component-mounting substrate and an electronic device with high reliability.

BRIEF DESCRIPTION OF DRAWINGS

FIG. 14 is a cross-sectional view of a component-mounting substrate showing one example of embedding properties according to comparative examples and Examples;

DETAILED DESCRIPTION OF EMBODIMENTS

Hereinafter, examples of an embodiment to which the present disclosure is applied will be described. Numerical values herein defined are values that are determined by methods disclosed in the embodiment or Examples. A numerical range of "A to B" herein defined refers to a range that satisfies the numerical value A, a value larger than the numerical value A, the numerical value B, and a value smaller than the numerical value B. The term "sheet" in the present specification includes not only a "sheet" defined in JIS but a "film". In order to clarify the description, the following descriptions and the drawings are simplified as appropriate. Further, the same components are denoted by the same symbols even in embodiments different from each other. Various components herein described may be each independently used alone or may be used in combination of two or more, unless otherwise specified.

Further, an average particle diameter $D_{50}$ of a conductive filler, an electromagnetic wave absorption filler, and an inorganic filler according to this embodiment can be obtained by a laser diffraction scattering method.

[Component-Mounting Substrate]

A component-mounting substrate according to this embodiment includes a substrate, electric components mounted on at least one surface of the substrate, and an electromagnetic wave shielding layer that covers step parts formed by mounting the electronic components and an exposed surface of the substrate. The electromagnetic wave shielding layer, which is to cover concave-convex parts on the substrate, covers at least a part of side surfaces and top surfaces of the electronic components and a surface of the substrate that is exposed. More preferably, the electromagnetic wave shielding layer covers the whole surface of the substrate on which the electronic components are mounted.

The component-mounting substrate according to this embodiment achieves excellent effects that concave-convex parts on the substrate can be covered uniformly with the electromagnetic wave shielding layer and embedding properties into the grooves are high even in a case in which, when the grooves of the step parts formed by mounting the electronic components have a grid shape and a width (a) of the groove (see FIG. 7) is assumed to be 1, a depth (b) of the groove (see FIG. 7) is 1-7 times as large as the width (a) and the width (a) of the groove is 50 to 500 μm.

Figure 1:
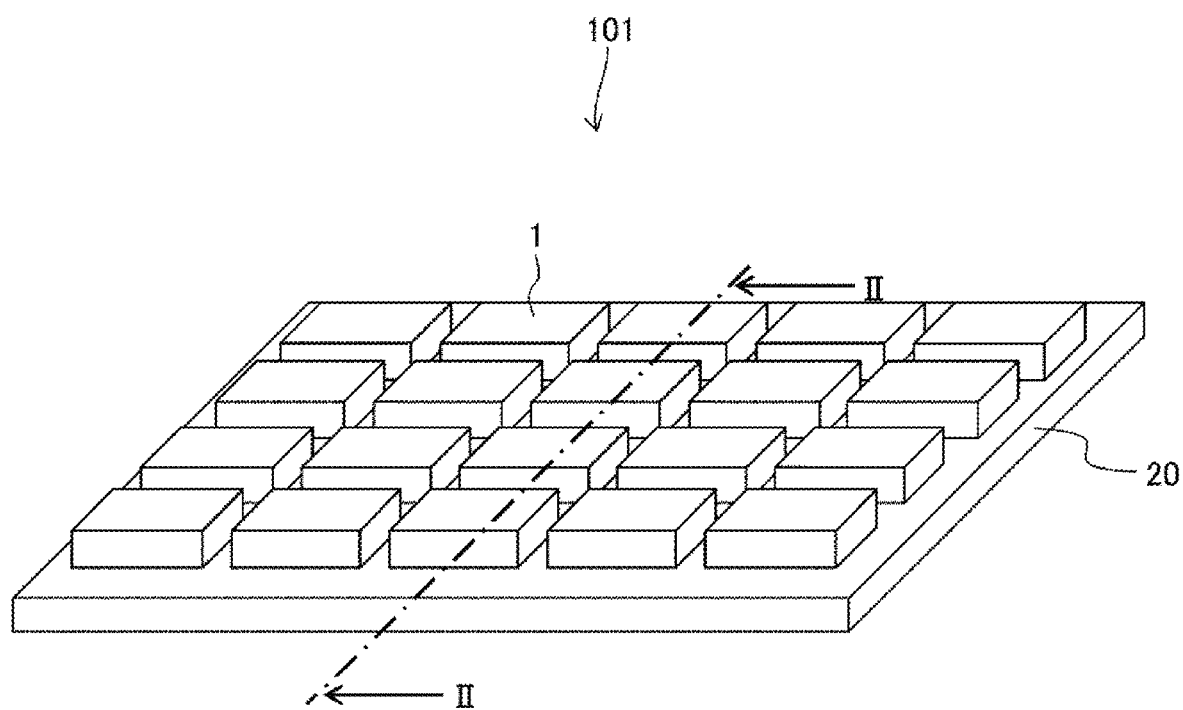
FIG. 1 is a schematic perspective view showing one example of an electronic component-mounting substrate according to an embodiment.
Figure 2:
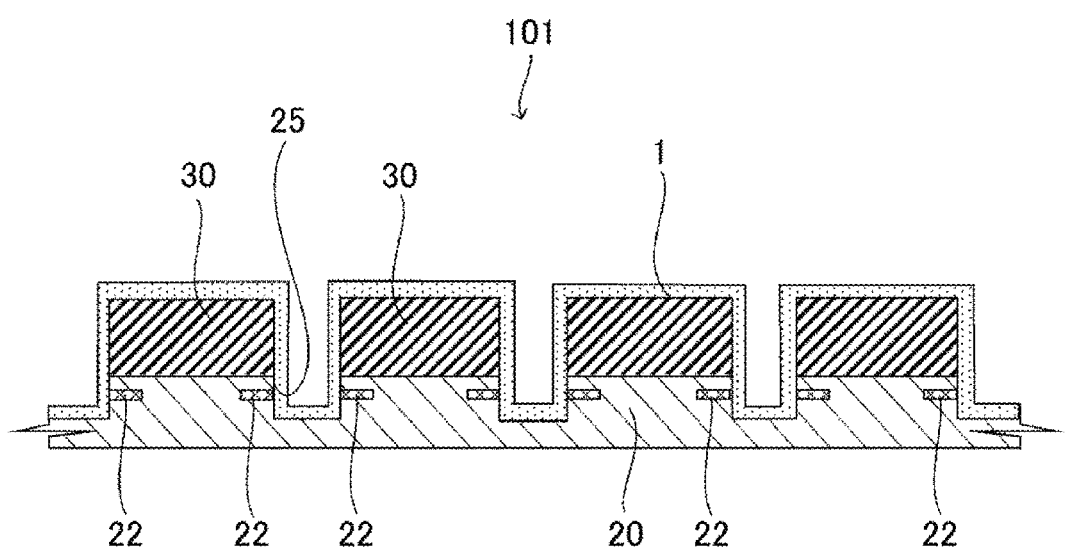
FIG. 2 is a cross-sectional view taken along the line II-II of FIG. 1.

FIG. 1 shows a schematic perspective view of the component-mounting substrate according to this embodiment and FIG. 2 shows a cross-sectional view taken along the line II-II of FIG. 1. A component-mounting substrate 101 includes a substrate 20, electronic components 30, an electromagnetic wave shielding layer 1 etc.

Another layer such as a film that exhibits favorable scratch resistance, a water vapor barrier property, and an oxygen barrier property, a film that enforces magnetic field cut or the like may be further laminated onto the component-mounting substrate 101.

<Substrate and Electronic Components>

It is sufficient that the substrate 20 be the one on which the electronic components 30 can be mounted and that can withstand a thermal pressing process, and the substrate 20 can be arbitrarily selected. The substrate 20 may be, for example, a work board with conductive patterns made of a copper foil or the like formed on its surface or inside thereof, a mounted module substrate, a printed wiring board, or a build-up substrate formed by a build-up method or the like. Further, the substrate 20 is not limited to be a rigid substrate and may also be a flexible substrate having a form of a film or a sheet. The conductive patterns are, for example, electrode/wiring patterns (not shown) to be electrically connected to the electronic components 30, or ground patterns 22 to be electrically connected to the electromagnetic wave shielding layer 1. Electrode/wiring patterns, vias (not shown) and the like can be arbitrarily provided inside the substrate 20.

The electronic components 30 are arranged in a shape of 5×4 arrays on the substrate 20 in the example shown in FIG. 1. Then the electromagnetic wave shielding layer 1 is provided so as to cover the exposed surface of the substrate 20 and the electronic components 30. That is, the electromagnetic wave shielding layer 1 is applied so as to follow the concave/convex parts, which are step parts formed by the electronic components 30.

Figure 3:
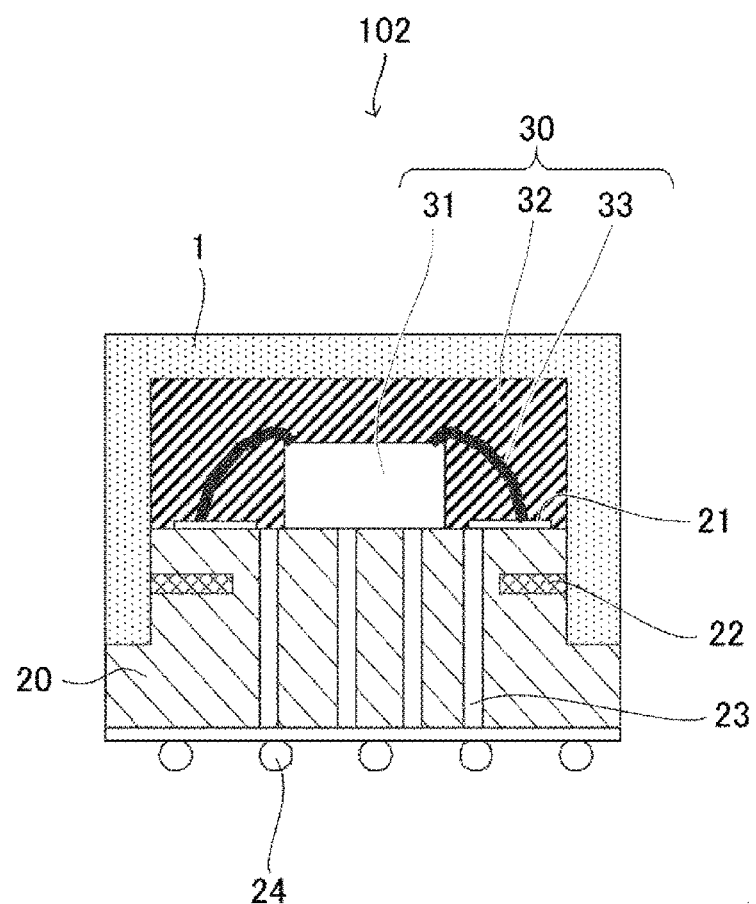
FIG. 3 is a schematic cross-sectional view showing another example of the electronic component-mounting substrate according to the embodiment.

The number, the arrangement, the shape, and the type of the electronic components 30 may be arbitrarily defined. In place of the form in which the electronic components 30 are arranged in the array shape, the electronic components 30 may be arranged in a desired position. When the component-mounting substrate 101 is divided into unit modules, as shown in FIG. 2, half-cut grooves 25, which are half dicing grooves, may be provided so as to define the unit modules in the thickness direction of the substrate from the upper surface of the substrate. The component-mounting substrate according to this embodiment includes both a substrate before it is divided into unit modules and a substrate after it is divided into unit modules. That is, the component-mounting substrate according to this embodiment includes, besides the component-mounting substrate 101 in which a plurality of unit modules (electronic components 30) as shown in FIGS. 1 and 2 are mounted, a component-mounting substrate 102 after the substrate is divided into unit modules as shown in FIG. 3. As a matter of course, the component-mounting substrate according to this embodiment also includes a component-mounting substrate in which one electronic component 30 is mounted on the substrate 20 and that is covered with the electromagnetic wave shielding layer without being divided. That is, the component-mounting substrate according to this embodiment encompasses a structure in which at least one electronic component is mounted on the substrate and at least a part of the step part formed by mounting the electronic component is covered with the electromagnetic wave shielding layer.

The electronic components 30 include all the components in which electronic elements such as semiconductor integrated circuits are integrally covered with a sealing resin. For example, there is a form in which a semiconductor chip 31 (see FIG. 3) including an integrated circuit (not shown) formed therein is molded by a sealing resin 32. The substrate 20 and the semiconductor chip 31 are electrically connected to a wire or electrodes 21 formed in the substrate 20 via these contact areas or bonding wires 33, solder balls (not shown) or the like. The electronic component may be, for example, other than a semiconductor chip, an inductor, a thermistor, a capacitor, a resistor or the like.

The edge of the electronic component in the step part preferably has R of 50 μm or smaller. Unless special processing is performed, the edge part of the groove formed by half dicing has an acute angle and has R of 50 μm or smaller. Although there is means for making R of the edge part more obtuse in order to reduce a crack of the electromagnetic wave shielding layer, the number of processes increases and the cost increases as well. On the other hand, when the electromagnetic wave shielding sheet according to this embodiment is used, there are excellent effects that, even when the edge has an acute angle, the crack of the electromagnetic wave shielding layer can be significantly reduced and the covering layer can be uniformly formed. It is not necessary that the edge has an acute angle and the present disclosure can be applied to edges having an angle of 90°, an obtuse angle, and an R-shaped edge.

The electronic components 30 and the substrate 20 according to this embodiment can be widely applied to known forms. In the example shown in FIG. 3, the semiconductor chip 31 is connected to solder balls 24 which are on the rear surface of the substrate 20 via inner vias 23. Further, ground patterns 22 to be electrically connected to the electromagnetic wave shielding layer 1 are formed in the substrate 20. Further, a plurality of electronic components 30 may be mounted on a component-mounting substrate after the substrate is divided into pieces. Further, one or more electronic elements or the like can be provided in the electronic component 30.

<Electromagnetic Wave Shielding Layer>

The electromagnetic wave shielding layer is formed by the electromagnetic wave shielding sheet according to this embodiment including at least a conducive layer. The electromagnetic wave shielding sheet is placed in such a way that the side of the electromagnetic wave shielding sheet on which the conductive layer is formed is placed on the electronic components and is thermally pressed, whereby the conductive layer covers at least a part of the side surfaces and the top surfaces of the electronic components and the electromagnetic wave shielding layer is formed.

The electromagnetic wave shielding layer may either contain a conductive filler and be used as an electromagnetic wave reflection layer or contain a radio wave absorption filler and be used as an electromagnetic wave absorption layer.

One example of the electromagnetic wave shielding layer will be described with reference to FIG. 2. The electromagnetic wave shielding layer 1 is obtained by placing an electromagnetic wave shielding sheet described later on the substrate 20 on which the electronic components 30 are mounted and thermally pressing the electromagnetic wave shielding sheet. The electromagnetic wave shielding layer 1 is the one in which the conductive layer of the electromagnetic wave shielding sheet is deformed and then cured. The conductive layer functions as an electromagnetic wave reflection layer by causing a binder resin and a conductive filler (an electromagnetic wave reflection filler) to be contained therein and imparting conductivity thereto. In the electromagnetic wave reflection layer, the conductive filler is continuously contacted and exhibits isotropic conductivity.

On the other hand, the conductive layer serves as an electromagnetic wave absorption layer by containing therein an electromagnetic wave absorption filler in place of the conductive filler. By using the electromagnetic wave reflection layer or the electromagnetic wave absorption layer, it is possible to shield unwanted radiation that occurs from signal wires or the like embedded in the electronic components 30 and/or the substrate 20 and prevent a malfunction due to external magnetic field or radio waves. Whether the electromagnetic wave shielding layer should be made to serve as the electromagnetic wave reflection layer or as the electromagnetic wave absorption layer can be selected as appropriate depending on the type of the electronic components and noise that requires external measures.

The area covered with the electromagnetic wave shielding layer is preferably the whole area of the step parts (concave-convex parts) formed by mounting the electronic components 30. The electromagnetic wave shielding layer preferably has a configuration in which it is connected to the ground patterns 22 that are exposed on the side surfaces or the upper surface of the substrate 20 or/and ground patterns (not shown) such as connecting wires or the like of the electronic components so that the electromagnetic wave shielding layer can sufficiently achieve the shielding effect. When it is difficult to connect the electromagnetic wave shielding layer to the above ground patterns with regard to its design, the electromagnetic wave shielding layer and a ground element of the substrate of the component-mounting substrate or a ground element of a housing or the like that incorporates therein the component-mounting substrate may be directly connected to each other by a conductive tape, a conductive gasket or the like.

The electromagnetic wave shielding layer may either be a single layer or a plurality of layers. When the electromagnetic wave shielding layer is formed of a plurality of layers, it is preferable to employ a form in which two conductive layers are laminated to each other. Examples of the plurality of preferable layers may include, for example, an electromagnetic wave shielding sheet in which two conductive layers whose amounts of conductive filler to be contained are different from each other are laminated to each other and an electromagnetic wave shielding sheet in which two layers including a fibrous (wire shape) conductive layer and a non-fibrous (non-wire shape) conductive layer are laminated to each other. Further, the electromagnetic wave shielding layer may include, for example, an electromagnetic wave shielding sheet including conductive layers that include conductive fillers whose shapes are different from each other such as, for example, an electromagnetic wave shielding sheet in which a conductive layer that contains a dendritic conductive filler and a conductive layer that contains a flaky conductive filler are laminated to each other. When the electromagnetic wave shielding layer is formed of a plurality of layers, the electromagnetic wave shielding layer preferably includes a conductive layer having a high conductivity arranged on the side that contacts the component-mounting substrate from the viewpoint of increasing the ground connectivity. Further, an electromagnetic wave shielding sheet formed by laminating a conductive layer before thermal pressing which functions as an electromagnetic wave reflection layer and a conductive layer before thermal pressing which functions as an electromagnetic wave absorption layer is preferable as well.

On the other hand, the electromagnetic wave shielding layer preferably does not include an anisotropically conductive layer since if it includes an anisotropically conductive layer, the connection reliability to the ground patterns 22 of the substrate 20 tends to worsen. This is because the ground contact probability of the ground positioned in the concave part (e.g., the bottom part) of the substrate on which the electronic components are mounted, and the conductive filler of the anisotropically conductive layer is reduced.

The thickness of the electromagnetic wave shielding layer may be designed as appropriate depending on its application. For applications where it is required to reduce the thickness, the thickness of the electromagnetic wave shielding layer that covers the upper surface and the side surfaces of the electronic components is preferably in a range of 2 to 75 μm, more preferably, 3 to 65 μm, and particularly preferably, 5 to 55 μm. For the application of shielding the high-frequency noise with a high accuracy, the thickness can be, for example, about 15 to 200 μm.

The part where the crack of the electromagnetic wave shielding layer tends to occur is parts that cover the edge parts of the electronic components 30. When the crack of the electromagnetic wave shielding layer occurs in the edge parts of the electronic components, it causes a reduction in the electromagnetic wave shielding effect. Therefore, the coverage of the concave-convex parts is particularly important.

The electromagnetic wave shielding layer according to this embodiment has extremely high edge covering properties.

The electromagnetic wave absorption layer may be formed of, besides a binder resin, a conductive layer having electromagnetic wave absorption properties including an electromagnetic wave absorption filler.

The electromagnetic wave absorption layer preferably has a form in which it covers the whole area of the step parts (concave-convex parts) formed by mounting the electronic components 30, similar to the electromagnetic wave reflection layer.

[Electromagnetic Wave Shielding Sheet]

The electromagnetic wave shielding sheet according to this embodiment includes at least a conducive layer.

By placing the electromagnetic wave shielding sheet on the substrate on which the electronic components are mounted and thermally pressing the electromagnetic wave shielding sheet, the conductive layer is embedded into the step parts of the electronic components and the substrate, whereby the electromagnetic wave shielding layer is formed. Depending on the height of the steps or the grooves or the strength of the substrate, the pressure and the temperature when the electromagnetic wave shielding sheet is thermally pressed may be set as appropriate.

The electromagnetic wave shielding sheet may include, besides the conductive layer, a reinforcement layer and a cushion layer that are laminated thereto in order to improve the handling properties and further improve the embedding properties into the step parts.

The method of stacking these layers may be, but not specially limited thereto, a method of laminating the respective layers, a method of coating the cushion layer with a conductive resin composition and performing printing etc.

Figure 4:
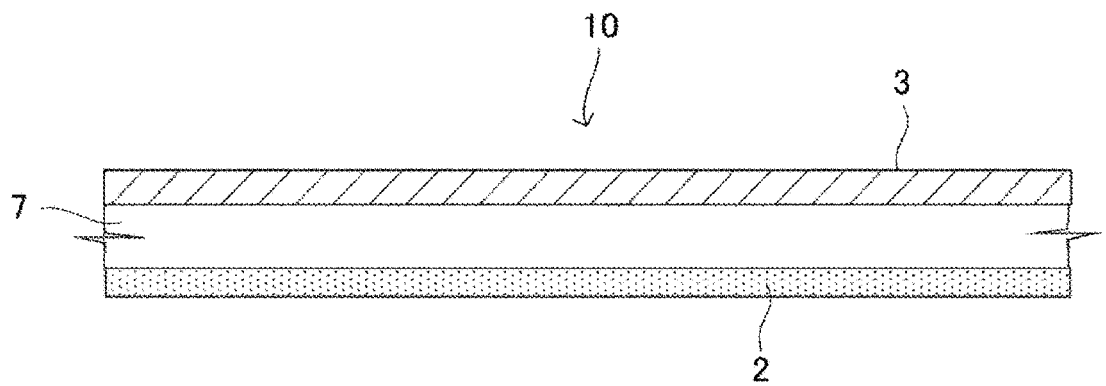
FIG. 4 is a schematic cross-sectional view showing one example of a laminate (a laminated body) according to the embodiment.

FIG. 4 shows an embodiment of an electromagnetic wave shielding sheet in which a cushion layer and a reinforcement layer are laminated to each other. An electromagnetic wave shielding sheet 10 shown in FIG. 4 includes a conductive layer 2, a cushion layer 7 formed on one principal surface of the conductive layer 2, and a reinforcement layer 3 formed on the cushion layer 7. A releasable base (not shown) may be laminated to the other principal surface of the conductive layer 2 to which the cushion layer 7 is not laminated. Further, the reinforcement layer 3 and the cushion layer 7 are preferably laminated to each other via an anchor layer.

Further, the electromagnetic wave shielding sheet may have a laminated structure of the cushion layer/conductive layer. Each of the cushion layer and the conductive layer may be a single layer independently or may be formed of a plurality of layers. In the laminated structure of the cushion layer/conductive layer, the area of the conductive layer is preferably made smaller than that of the cushion layer and is preferably laminated in such a way that the electromagnetic wave shielding sheet includes a frame region of the cushion layer (the conductive layer is laminated on the cushion layer in an island shape) in a plan view. According to the above structure, it is possible to efficiently prevent the conductive layer from exuding from the cushion layer when the electromagnetic wave shielding sheet is thermally pressed and prevent the conductive layer from being attached to another member such as a thermal pressing apparatus.

(Conductive Layer)

The conductive layer, which is a layer for forming the electromagnetic wave shielding layer, at least contains a binder resin, and a conductive filler or an electromagnetic wave absorption filler.

The Young's modulus of the conductive layer at 23° C. is 10 to 700 MPa. The Young's modulus at 23° C. is, more preferably, 30 to 500 MPa, and further preferably, 50 to 300 MPa. By making the conductive layer have the Young's modulus at 23° C. of 10 to 700 MPa, the embedding properties, the ground connectivity, and the edge covering properties can be improved. In addition, the PCT resistance is also improved.

The "Young's modulus at 23° C." according to this embodiment can be obtained as follows.

The conductive layer that has been left to stand at 23° C. and a relative humidity of 50% for 24 hours is measured in a constant temperature and humidity environment with a temperature of 23° C. and a relative humidity of 50%. The stress-strain curve of the conductive layer is measured by a tensile tester under conditions of a tensile speed of 50 mm/min and a bench mark of 25 mm, and the linear regression (inclination) of the region in which the distortion (elongation) is in a range of 0.1 to 0.3% is set to be the Young's modulus at 23° C.

The conductive layer that satisfies the above Young's modulus at 23° C. may be obtained, for example, by applying a conductive resin composition containing at least a thermosetting resin as a binder resin and a conductive filler or an electromagnetic wave absorption filler on a peelable sheet, followed by drying, and aging in a thermal environment, and semi-curing the obtained layer. The drying process and the aging process in a thermal environment here may be performed concurrently or at different timings.

Further, the Young's modulus of the conductive layer at 80° C. is preferably 5 to 80 MPa, more preferably, 9 to 65 MPa, and further preferably, 13 to 60 MPa. By setting the Young's modulus at 80° C. to 5 to 85 MPa, elongation at the time of thermal pressing is improved, and the embedding properties and the ground connectivity can be improved.

The "Young's modulus at 80° C." according to this embodiment can be obtained in a way similar to that when the Young's modulus at 23° C. is obtained except that the stress-strain curve is measured in a chamber at 80° C. and a relative humidity of 50%.

Further, the ratio [Young's modulus at 23° C.]/[Young's modulus at 80° C.] of [Young's modulus at 23° C.] to [Young's modulus at 80° C.] is preferably 1.8 to 8.5. More preferably, it is 3.2 to 8.5, and further preferably, 3.9 to 7.1. By setting the ratio [Young's modulus at 23° C.]/[Young's modulus at 80° C.] to a range from 1.8 to 8.5, when the electromagnetic wave shielding sheet is thermally pressed to form the electromagnetic wave shielding layer, the embedding properties into the component-mounting substrate, the ground connectivity, the edge covering properties, and the PCT resistance can be efficiently increased.

The conductive layer functions as an electromagnetic wave shielding layer after the thermal pressing. The conductive layer can be obtained by forming a conductive resin composition in which a binder resin is mixed with a conductive filler or an electromagnetic wave absorption filler into a sheet.

Further, the curing degree of the conductive layer is preferably 60 to 99%, more preferably, 65 to 98%, and further preferably, 70 to 97%. By setting the curing degree to 60% or greater, the breaking strength of the conductive layer increases and the edge resistance can be further improved. On the other hand, by setting the curing degree to 99% or smaller, elongation at the time of thermal pressing is improved and the embedding properties into the grooves can be further improved.

The "curing degree" according to this embodiment can be obtained as follows.

A 100-mesh wire netting is cut into a size of a width of 30 mm and a length of 100 mm to measure the weight (W1). Then, a conductive layer having a width of 10 mm and a length of 80 mm is wrapped with the aforementioned wire netting to form a test piece, and the weight (W2) thereof is measured. The manufactured test piece is immersed into the solvent at room temperature for two hours, the test piece is then removed from the solvent and dried at 120° C. for 30 minutes, and then the weight (W3) thereof is measured. The content ratio of the conductive layer that remains in the wire netting without being dissolved is calculated as a curing degree using the following calculation formula [I].

$$(W3-W1)/(W2-W1)\times 100 [\%] \qquad [I]$$

The solvent that has the highest solubility of the conductive layer among a single or mixed solvent selected from methyl ethyl ketone (hereinafter referred to as MEK), toluene, isopropyl alcohol, and chloroform is selected as the solvent.

Further, the glass transition temperature (Tg) of the conductive layer is preferably −15 to 30° C., more preferably, −10 to 25° C., and further preferably, −5 to 20° C. By setting the glass transition temperature (Tg) of the conductive layer to above ranges, the conductive layer can easily follow the concaves and the convexes when it is thermally pressed and the embedding properties and the ground connectivity are further improved.

Further, the glass transition temperature (Tg) after the conductive layer is heated at 180° C. for two hours is preferably 0 to 80° C., more preferably, 20 to 80° C., further preferably, 25 to 65° C., and particularly preferably, 30 to 55° C. By setting the glass transition temperature (Tg) after the conductive layer is heated at 180° C. for two hours to 0° C. or greater, the PCT resistance of the formed electromagnetic wave shielding layer is further improved, which is preferable. Further, by setting the glass transition temperature (Tg) after the conductive layer is heated at 180° C. for two hours to 80° C. or lower, it is possible to reduce warpage of the component-mounting substrate and improve the yield.

The Tg of the conductive layer and the layer after the conductive layer is heated at 180° C. for two hours can be measured by a dynamic viscoelasticity analyzer.

The storage modulus at 25° C. after the conductive layer is heated at 180° C. for two hours is preferably 0.5 to 8 GPa, more preferably, 1 to 7 GPa, and further preferably, 2 to 6 GPa. The storage modulus is preferably set to the above range so that the PCT resistance of the formed electromagnetic wave shielding layer is further improved and the scratch resistance is improved as well. The storage modulus herein means a value of the storage modulus at 25° C. measured under conditions of a deformation mode "pulling" with respect to a measurement sample, a frequency of 10 Hz, a temperature rising rate of 10° C./min, and a measurement temperature range of −50 to 300° C. using a dynamic viscoelasticity measuring apparatus DVA-200 (manufactured by I. T. Keisoku Seigyo Co., Ltd.).

Further, the linear expansion coefficient of the conductive layer at a temperature from −50° C. to 50° C. is preferably 10 to 300 ppm, more preferably, 20 to 250 ppm, and further preferably, 30 to 200 ppm. Further, the linear expansion coefficient thereof at a temperature from 50° C. to 170° C. is preferably 50 to 500 ppm, more preferably, 70 to 400 ppm, and further preferably, 80 to 300 ppm. Accordingly, it is possible to efficiently prevent occurrence of warpage, distortion and the like of the electronic components. As the linear expansion coefficient, values measured by the testing method for linear expansion of plastics by thermomechanical analysis described in JIS-K7197 are herein used.

The conductive layer has such a thickness that it is able to cover the top surfaces and the side surfaces of the electronic components and the exposed surface of the substrate. The above thickness is preferably 12 to 90 μm, more preferably, 18 to 80 μm, and further preferably, 23 to 70 μm although it may vary depending on the fluidity of the binder resin to be used or the size of the distance between the electronic components. When the film thickness is 12 μm or greater, the embedding properties, the ground connectivity, and the edge resistance are improved. On the other hand, when the film thickness is 90 μm or smaller, the handling properties can be improved and the thickness of the electronic device can be reduced.

«Binder Resin»

A binder resin that forms a conductive layer will be described.

A thermosetting resin is preferably used as the binder resin. The thermosetting resin may have a curable compound reaction type. Further, the thermosetting resin may be self-crosslinked. When the thermosetting resin is used, it preferably includes a reactive functional group that can react with the curable compound.

Preferable examples of the thermosetting resin may include polyurethane resins, polyurethane-urea resins, phenoxy resins, acrylic resins, polyester resins, polyamide resins, epoxy resins, polystyrene resins, polycarbonate resins, polyamide-imide resins, polyester amide resins, polyether-ester resins, and polyimide resins. The thermosetting resin may include a functional group that can be self-crosslinked. For example, the thermosetting resin when it is used under severe conditions during reflow preferably includes at least one of epoxy resins, urethane resins, urethane-urea resins, polycarbonate resins, and polyamide. Further, the thermosetting resin and the thermoplastic resin can be used together as long as they can withstand the heating process.

The reactive functional group of the thermosetting resin includes a carboxyl group, a hydroxyl group, an epoxy group etc. The acid value of the thermosetting resin is preferably 3 to 30 mgKOH/g. By making the thermosetting resin have the acid value in this range, the effect that the edge covering properties are improved can be obtained. A more preferable range of the acid value is 4-20 mgKOH/g, and a further preferable range is 5 to 10 mgKOH/g.

The curable compound includes a functional group that can be crosslinked with a reactive functional group of the thermosetting resin. Preferable examples of the curable compound include epoxy compounds, isocyanate compounds, polycarbodiimide compounds, aziridine compounds, acid anhydride group-containing compounds, dicyandiamide compounds, amine compounds such as aromatic diamine compounds, phenol compounds such as a phenol novolak resin, organometallic compounds etc. The curable compound may be a resin. In this case, the thermosetting resin and the curable compound are differentiated from each other depending on the content amount. That is, the thermosetting resin has a larger content amount and the curable compound has a smaller content amount.

The structure and the molecular weight of the curable compound can be designed as appropriate depending on the application.

The Young's modulus of the conductive layer can be controlled by adjusting the content amounts of the thermosetting resin and the curable compound described above or by combining different types. The Young's modulus can be controlled, for example, by changing the blending ratio of, for example, a mixed system of a polyurethane resin and a polycarbonate resin, a mixed system of a polycarbonate resin and a styrene resin, and a mixed system of a polyurethane resin and a phenoxy resin. In addition, a method of mixing a plurality of curable compounds and changing the blending ratio thereof is also effective for controlling the Young's modulus.

Further, the Young's modulus of the conductive layer can be controlled also depending on the type and amount of conductive filler to be added described later. Changing the average particle diameter $D_{50}$ of the conductive filler, the BET specific surface area, the tap density, and the surface treatment is also effective for controlling the Young's modulus.

The curable compound preferably includes an amount of 1 to 70 pts·mass, more preferably, 3 to 65 pts·mass, and further preferably, 3 to 60 pts·mass relative to 100 pts·mass of the thermosetting resin.

The epoxy compound, which is not particularly limited as long as it includes an epoxy group, is preferably a multifunctional epoxy compound. The epoxy group of the epoxy compound is thermally cross-linked with a carboxyl group or a hydroxyl group of the thermosetting resin in the thermal pressing and the like, whereby it is possible to obtain a cross-linked structure. As the epoxy compound, an epoxy compound that is liquid at room temperature and ordinary pressure is preferable.

The epoxy equivalent of the epoxy compound is preferably in a range of 120 to 300 g/eq, more preferably, in a range of 180 to 280 g/eq, and particularly preferably, in a range of 200 to 260 g/eq. By setting the epoxy equivalent of the epoxy compound to be in a range of 120 to 300 g/eq, the crosslinked density of the conductive layer in a semi-cured product is adjusted and the edge covering properties can be efficiently increased.

As the binder resin, other than the above resins, tackifying resins or thermoplastic resins may be used. Preferable examples of the thermoplastic resins may be polyolefin resins, vinyl resins, styrene acrylic resins, diene resins, terpene resins, petroleum resins, cellulose resins, polyamide resins, polyurethane resins, polyester resins, polycarbonate resins, fluorine resins or the like. The tackifying resins may be, for example, rosin resins, terpene resins, alicyclic petroleum resins, and aromatic petroleum resins. Further, a conductive polymer may be used. The conductive polymer may be, for example, polyethylenedioxythiophene, polyacetylene, polypyrrole, polythiophene, or polyaniline.

«Conductive Filler»

The conductive filler (electromagnetic wave reflection filler) may be, for example, a metal filler, a conductive ceramics filler, and a mixture thereof. The metal filler may be, for example, a core-shell type filler of a metal powder such as gold, silver, copper and nickel, an alloy powder such as solder, a silver-coated copper powder, a gold-coated copper powder, a silver-coated nickel powder, or a gold-coated nickel powder. From the viewpoint of obtaining excellent conductive properties, a conductive filler that contains silver is preferably used. From the perspective of reducing the cost, a silver-coated copper powder is particularly preferable. The amount of silver contained in the silver-coated copper is preferably 6-20 mass %, more preferably, 8 to 17 mass %, and further preferably, 10 to 15 mass % in the 100 mass % of the conductive filler. In the case of the core-shell type filler, the covering rate of the coating layer on a core part is preferably 60 mass % or greater in average, more preferably, 70 mass % or higher, and further preferably, 80 mass % or higher in the 100 mass % of the entire surface. Although the core part may be non-metallic, the core part is preferably a conductive substance from the viewpoint of conductivity, and a metal filler is more preferable.

The shape of the conductive filler is preferably flaky (scaly). Further, a flaky conductive filler and a conductive filler having another shape may be used together. The shape of the conductive filler that is used together with the flaky conductive filler is preferably, but not specially limited thereto, a dendritic (dendrite), fibrous, acicular, or spherical conductive filler. The conductive filler that is used together with the flaky conductive filler is used alone or in combination. When the other conductive filler is used together with the flaky conductive filler, a combination of a flaky conductive filler and a dendritic filler, a combination of a flaky conductive filler, a dendritic conductive filler, and a spherical conductive filler, and a combination of a flaky conductive filler and a spherical conductive filler may be used as an example. Among them, from the viewpoint of increasing the edge covering properties of the electromagnetic wave shielding layer, a flaky conductive filler alone or a combination of a flaky conductive filler and a dendritic conductive filler is more preferable.

The average particle diameter $D_{50}$ of the flaky conductive filler is preferably 2 to 100 µm, and more preferably, 2 to 80 µm. Further preferably, it is 3 to 50 µm, and particularly preferably, 5 to 20 µm. Likewise, a preferable range of the average particle diameter $D_{50}$ of the dendritic conductive filler is 2 to 100 µm, and more preferably, 2 to 80 µm, further preferably, 3 to 50 µm, and particularly preferably, 5 to 20 µm.

The amount of the conductive filler to be contained in the conductive layer is preferably 40 to 95 mass % with respect to the entire conductive layer from the viewpoint of obtaining excellent electromagnetic shield properties. The lower-limit value is, more preferably, 45 mass %, further preferably, 50 mass %, and particularly preferably, 55 mass %.

«Electromagnetic Wave Absorption Filler»

The electromagnetic wave absorption filler may be, for example, iron, iron alloy such as Fe—Ni alloy, Fe—Co alloy, Fe—Cr alloy, Fe—Si alloy, Fe—Al alloy, Fe—Cr—Si alloy, Fe—Cr—Al alloy, or Fe—Si—Al alloy, and a carbon filler. The carbon filler may be, for example, a filler made of acetylene black, ketjen black, furnace black, carbon black, carbon fibers, or carbon nanotubes, a graphene filler, a graphite filler, and carbon nanowalls.

Preferable examples of the shape of the electromagnetic wave absorption filler and the average particle diameter $D_{50}$ are similar to those of the aforementioned electromagnetic wave reflection filler.

The amount of the electromagnetic wave absorption filler contained in the conductive layer to form the electromagnetic wave absorption layer is preferably 5 to 75 mass % with respect to the entire conductive layer that contains the electromagnetic wave absorption filler from the viewpoint of obtaining excellent electromagnetic wave absorption properties. The lower-limit value is, more preferably, 10 mass %, further preferably, 15 mass %, and particularly preferably, 20 mass %.

Further, the conductive layer can be formed of a conductive resin composition at least containing a binder resin and a conductive filler or an electromagnetic wave absorption filler. The conductive resin composition may further include colorants, flame retardants, inorganic additives, lubricants, anti-blocking agents or the like.

The flame retardants may be, for example, halogen containing flame retardants, phosphorus-containing flame retardants, nitrogen-containing flame retardants, inorganic flame retardants etc.

The inorganic additives may be, for example, glass fibers, silica, talc, ceramic etc.

The lubricants may be, for example, fatty acid ester, a hydrocarbon resin, paraffin, higher fatty acid, fatty acid amide, aliphatic alcohol, a metal soap, modified silicone etc.

The anti-blocking agents may be, for example, calcium carbonate, silica, polymethylsilsesquioxane, aluminum silicate etc.

The method of applying the conductive resin composition may be, for example, a gravure coating method, a kiss coating method, a die coating method, a LIP coating method, a Comma Coating method, a blade method, a roll coating method, a knife coating method, a spray coating method, a bar coating method, a spin coating method, and a dip coating method.

(Reinforcement Layer)

The reinforcement layer 3 is used to impart handling properties of the electromagnetic wave shielding sheet and to transmit the pressing force to the cushion layer 7 and to bury the conductive layer 2 into the grooves of the step parts of the adherend at the time of thermal pressing. In addition, the reinforcement layer 3 serves as a support when the cushion layer 7 that has been deformed and cut into the grooves of the step parts (concaves and convexes) is peeled off after the thermal pressing, which significantly improves the peelability.

The reinforcement layer can be selected from a resin film, a metal plate and the like as appropriate, and may be, for example, a plastic sheet of polyethylene terephthalate, polyethylene naphthalate, polyvinyl fluoride, polyvinylidene fluoride, rigid polyvinyl chloride, polyvinylidene chloride, nylon, polyimide, polystyrene, polyvinyl alcohol, an ethylene vinyl alcohol copolymer, polycarbonate, polyacrylonitrile, polybutene, soft polyvinyl chloride, polyvinylidene fluoride, polyethylene, polypropylene, polyurethane resin, an ethylenevinyl acetate copolymer, polyvinyl acetate etc., papers such as a glassine paper, a woodfree paper, a kraft paper, and a coated paper, various non-woven fabrics, a synthetic paper, a metal foil, or a composite film in which they are combined. Among them, the reinforcement layer is preferably any one of polyethylene terephthalate, polyester, polycarbonate, polyimide, and polyphenylene sulfide in view of handling properties and the cost. Further, polyethylene terephthalate and polyimide are more preferable.

The thickness of the reinforcement layer is preferably 20 µm or greater, more preferably, 25 µm or greater, and further preferably, 38 µm or greater. By making the reinforcement layer have a thickness of 20 µm or greater, the strength of the reinforcement layer is improved, which causes the embedding properties, the releasability, and the handling properties to be further improved. Further, the thickness of the reinforcement layer is preferably, but not particularly limited thereto, 250 µm or smaller since in this case the releasability and the handling properties of the electromagnetic wave shielding sheet are improved.

(Cushion Layer)

The cushion layer, which is a layer that is melted at the time of thermal pressing, functions as a cushion material that prompts followability of the conductive layer 2 to the step parts formed by mounting the electronic components 30. In addition, the cushion layer is a layer that has releasability, and can be peeled off from the conductive layer after the thermal pressing process without being bonded to the conductive layer.

When the cushion layer includes a release layer, it indicates a configuration in which an element that has cushioning properties is combined with the release layer.

The cushion layer can be formed of a thermoplastic resin composition at least including a thermoplastic resin. Further, the thermoplastic resin composition may include, besides the thermoplastic resin, a plasticizer, a thermosetting agent, an inorganic filler or the like.

The thermoplastic resin may be a polyolefin resin, an acid-modified polyolefin resin grafted with acid, a copolymer resin of polyolefin and unsaturated ester, a vinyl resin, a styrene acrylic resin, a diene resin, a cellulose resin, a polyamide resin, a polyurethane resin, a polyester resin, a polycarbonate resin, a polyimide resin, or a fluororesin.

Among them, a polyolefin resin, an acid-modified polyolefin resin grafted with acid, a copolymer resin of polyolefin and unsaturated ester, and a vinyl resin are preferable.

As the thermoplastic resin, one kind may be used alone or two or more kinds of resins may be mixed at a desired ratio as necessary.

The polyolefin resin is preferably a homopolymer or a copolymer of ethylene, propylene, α-olefin compounds and the like. Specifically, the polyolefin resin may be, for example, low density polyethylene, ultra low density polyethylene, linear low-density polyethylene, high density polyethylene, polypropylenehomopolymer, a polypropylene copolymer and the like.

Among them, a polyethylene resin and a polypropylene resin are preferable, and a polyethylene resin is more preferable.

The acid-modified polyolefin resin is preferably a polyolefin resin grafted with maleic acid, acrylic acid, methacrylic acid, itaconic acid or the like.

Among them, a maleic acid-modified polyolefin resin is preferable.

The unsaturated ester in a copolymer resin of polyolefin and unsaturated ester may be methyl acrylate, ethyl acrylate, isobutyl acrylate, n-butyl acrylate, isooctyl acrylate, methyl methacrylate, isobutyl methacrylate, dimethyl maleate, diethyl maleate, glycidyl methacrylate or the like.

Among them, an ethylene-glycidyl methacrylate copolymer resin in which ethylene is used as polyolefin and glycidyl methacrylate is used as unsaturated ester is preferable.

The vinyl resin is preferably a polymer obtained by polymerization of vinyl ester such as vinyl acetate and a copolymer of vinyl ester and an olefin compound such as ethylene. Specifically, the vinyl resin may be, for example, an ethylene-vinyl acetate copolymer, an ethylene-vinyl propionate copolymer, a partially saponified polyvinyl alcohol or the like.

Among them, an ethylene-vinyl acetate copolymer is preferable.

The styrene acrylic resin is preferably a homopolymer or a copolymer formed of styrene, (meth)acrylonitrile, acrylamides, or maleimides or the like. Specifically, the styrene acrylic resin may be, for example, syndiotacticpolystyrene, polyacrylonitrile, an acrylic copolymer or the like.

The diene resin is preferably a homopolymer or a copolymer of a conjugate diene compound such as butadiene or isoprene, and a hydrogenated product thereof. Specifically, the diene resin may be, for example, styrene-butadiene rubber, a styrene-isoprene block copolymer, a styrene-ethylene butylene-styrene block copolymer, a styrene-ethylene propylene-styrene block copolymer, a styrene-isoprene-styrene block copolymer, a styrene-butylenebutadiene-styrene block copolymer, and a mixture of a styrene-ethylenebutylene-styrene block copolymer and a styrene-ethylenebutylene block copolymer.

The cellulose resin is preferably a cellulose acetate butyrate resin. The polycarbonate resin is preferably bisphenol A polycarbonate.

The polyimide resin is preferably thermoplastic polyimide, a poly amide-imide resin, or a polyamic acid type polyimide resin.

Figure 5:
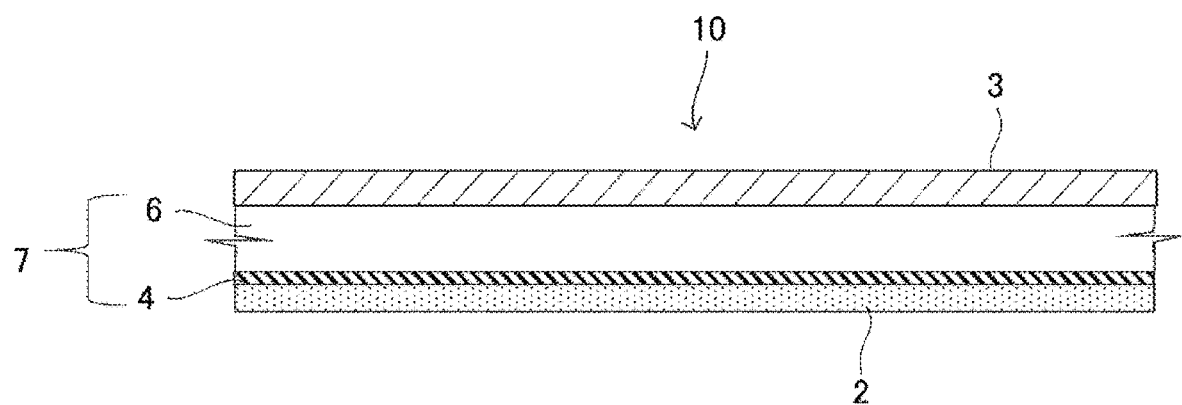
FIG. 5 is a schematic cross-sectional view showing one example of the laminate according to the embodiment.

As shown in FIG. 5, the cushion layer 7 may have a form that includes, besides an element having cushioning properties 6, a release layer 4 so that the cushion layer after the thermal pressing can be easily peeled off from the electromagnetic wave shielding layer. As the release layer 4, a layer made of polypropylene, polymethylpentene, a cyclic olefin polymer, silicone, or a fluororesin is preferably formed. Among them, polypropylene, polymethylpentene, silicone, and a fluororesin are further preferable.

Other than the aforementioned aspects, an aspect for applying a releasing agent such as alkyd, silicone is also preferable.

The thickness of the release layer is preferably 0.001 to 70 μm, and more preferably, 0.01 to 50 μm.

As the commercially available cushion layer, "CR1012", "CR1012MT4", "CR1031", "CR1033", "CR1040", "CR2031MT4" or the like manufactured by Mitsui Chemicals Tohcello. Inc. may be used. These commercially available cushion layers have a configuration in which polymethylpentene is provided on the both surfaces of a cushion layer as a release layer so as to sandwich the cushion layer, and in this application, these integrated structures are referred to as a cushion layer. By laminating the reinforcement layer to one of its surfaces, it is possible to improve the embedding properties and reduce the substrate crack.

The thickness of the cushion layer is preferably 50 to 300 μm, more preferably, 75 to 250 μm, and further preferably, 100 to 200 μm. By making the cushion layer have a thickness of 50 μm or larger, the embedding properties can be improved. By making the cushion layer have a thickness of 300 μm or smaller, the handling properties of the electromagnetic wave shielding sheet can be improved. The thickness of the cushion layer is, when it includes a release layer, a value including the release layer.

(Anchor Layer)

The reinforcement layer and the cushion layer are preferably laminated to each other with the anchor layer interposed therebetween.

Figure 6:
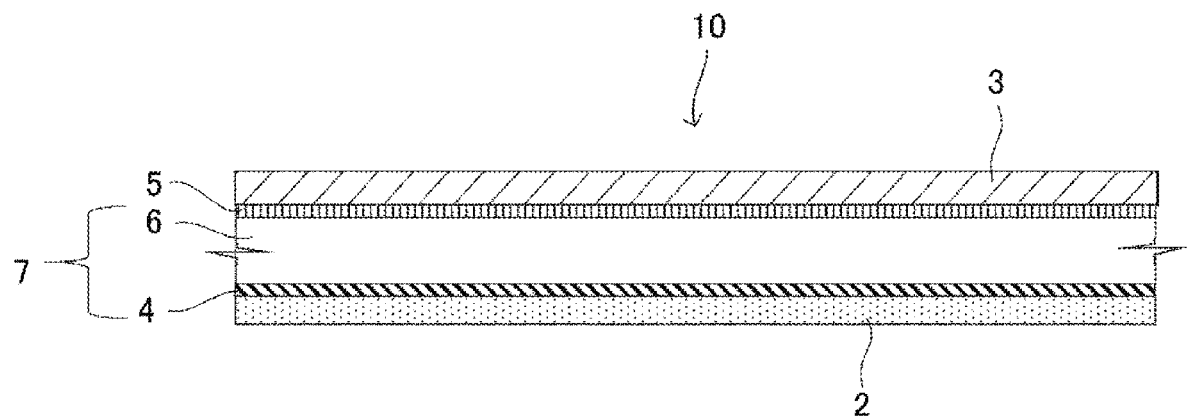
FIG. 6 is a schematic cross-sectional view showing one example of the laminate according to the embodiment.

As shown in FIG. 6, the cushion layer 7 may include an anchor layer 5 in an interface between the reinforcement layer 3 and the cushion layer 7. The anchor layer 5 plays a role of bonding the cushion layer 7 with the reinforcement layer 3. Since the cushion layer 7 is fixed to the anchor layer 5 at the time of thermal pressing, it is embedded into the concaves and the convexes more definitely. Further, when the cushion layer 7 is peeled off after the thermal pressing, it is possible to prevent interfacial peeling of the cushion layer 7 from the reinforcement layer 3 and to improve the yield.

The anchor layer 5 may be any layer as long as the adhesiveness is not reduced and foaming does not occur due to the temperature of the thermal pressing and may be a tackifier (a pressure sensitive adhesive) and other adhesive.

The tackifier is preferably an acrylic tackifier or a urethane tackifier.

As an adhesive other than the tackifier, a thermosetting adhesive, a pressure sensitive adhesive, or a water-curable adhesive may be used. As the thermosetting adhesive, a thermosetting resin described in the conductive layer 2 and a curing agent may be used.

Figure 13:
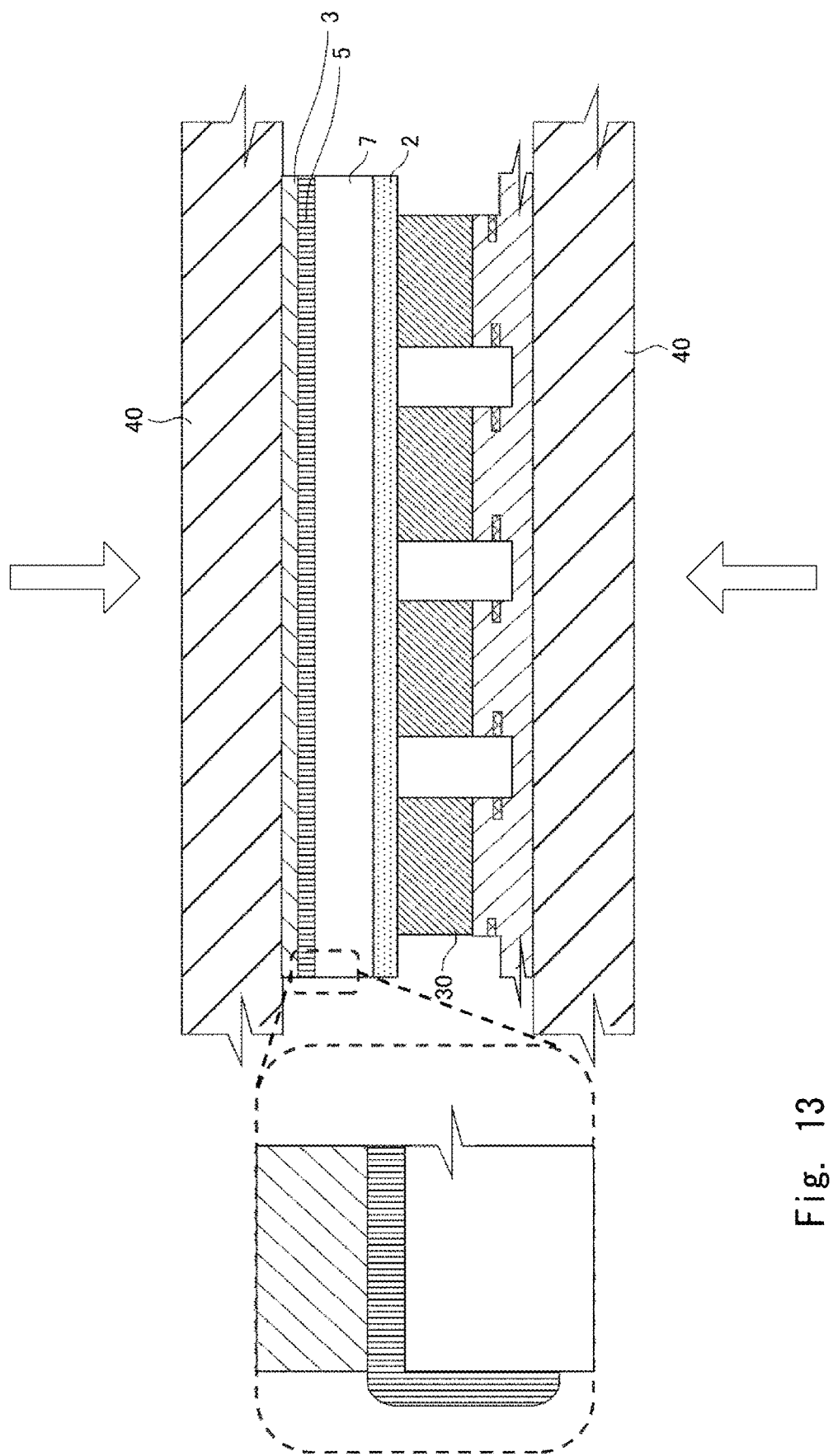
FIG. 13 is a cross-sectional view of the process of manufacturing the electronic component-mounting substrate according to the embodiment.

When a tackifier is used in the anchor layer 5, as shown in FIG. 13, an end part of the anchor layer 5 flows so as to cover an end part of the cushion layer 7 at the time of thermal pressing, thereby preventing the cushion layer 7 from flowing in the lateral direction. This, as a result, causes of the cushion layer 7 to be pressed into the grooves in the step parts (concaves and convexes), and the electromagnetic wave shielding layer 1 in which the conductive layer 2 is uniformly embedded into the concave parts as well can be formed.

The thickness of the anchor layer 5 is preferably 1 to 70 μm, and more preferably, 3 to 50 μm. By making the anchor layer 5 have the above thickness, the cushion layer 7 can be prevented from flowing in the lateral direction, and the embedding properties are improved since the pressing force can be efficiently transmitted to the cushion layer 7.

The thicknesses of the conductive layer, the reinforcement layer, and the cushion layer described above may be measured by a contact-type film thickness meter and by observing the cross sections thereof.

Modified Example 1

While the example in which the conductive layer is used as the layer before thermal pressing of the electromagnetic wave shielding layer has been described in the aforementioned embodiment, a magnetic layer may be used in place of or in addition to the conductive layer. The magnetic layer herein means a layer that serves as an electromagnetic wave absorption layer by thermal pressing, and indicates a layer that exhibits magnetism although it does not exhibit conductivity as the electromagnetic wave absorption layer. The magnetic layer does not necessarily exhibit magnetism at the stage in which it is formed, and it is sufficient that it exhibits magnetism in the electromagnetic wave absorption layer after thermal pressing. Further, it is assumed that the magnetic layer does not include the layers that form the electromagnetic wave reflection layer and the electromagnetic wave absorption layer having conductivity described in the aforementioned embodiment. That is, it is assumed that the layer that forms the electromagnetic wave absorption layer that has both conductive and magnetic properties is classified into a conductive layer. The electromagnetic wave shielding sheet according to the modified example 1 may be used, unless otherwise specified, by simply replacing the conductive layer according to the aforementioned embodiment by a magnetic layer.

The magnetic layer can be obtained by a composition, blending, and a manufacturing method similar to those of the conductive layer except that the electromagnetic wave absorption filler is replaced by a filler that forms the magnetic layer. The Young's modulus at 23° C. obtained as the magnetic layer is similar to that in the conductive layer. Further, suitable ranges (preferable ranges, more preferable ranges, and further preferable ranges) of the Young's modulus of the magnetic layer at 80° C., the ratio [Young's modulus at 23° C.]/[Young's modulus at 80° C.], and the curing degree are similar to those of the conductive layer. The same is applicable also to the suitable ranges (preferable ranges, more preferable ranges, and further preferable ranges) of the glass transition temperature (Tg) of the magnetic layer and the glass transition temperature (Tg) after the magnetic layer is heated at 180° C. for two hours. Further, the preferable range of the preferable average particle diameter $D_{50}$ of the electromagnetic wave absorption filler (magnetic filler) for forming the magnetic layer is similar to those of the conductive filler and the electromagnetic wave absorption filler. Further, a resin similar to that in the aforementioned embodiment can be preferably used as the binder resin.

As the electromagnetic wave absorption filler for forming the magnetic layer, a filler made of a carbon material or magnetic iron oxide can be, for example, used. For example, a ferrite material such as Mg—Zn ferrite, Mn—Zn ferrite, Mn—Mg ferrite, Cu—Zn ferrite, Mg—Mn—Sr ferrite, Ni—Zn ferrite or the like may be, for example, used. The electromagnetic wave absorption filler for forming the magnetic layer may include the conductive filler or the electromagnetic wave absorption filler illustrated in the aforementioned embodiment.

According to the modified example 1, it is possible to obtain the effects similar to those obtained in the aforementioned embodiment.

[Method of Manufacturing Component-Mounting Substrate]

With reference to FIGS. 7 to 11, one example of a method of manufacturing the component-mounting substrate according to this embodiment will be described. However, the manufacturing method according to the present disclosure is not limited to this method.

The method of manufacturing the component-mounting substrate includes a process (a) of mounting the electronic components 30 onto the substrate 20, a placement process (b) of providing the electromagnetic wave shielding sheet 10 formed of the reinforcement layer 3, the cushion layer 7, and the conductive layer onto the substrate 20 on which the electronic components 30 are mounted, a process (c) of bonding, by thermal pressing, the electromagnetic wave shielding sheet 10 to the substrate 20 in such a way that the conductive layer 2 follows the exposed surface of the substrate 20 including at least a part of the step parts formed by mounting the electronic components 30 thereon, thereby obtaining the electromagnetic wave shielding layer 1, and the following process (d) of removing the cushion layer 7 and the reinforcement layer 3.

<Process (a)>

The process (a) is a process of mounting the electronic components on the substrate.

Figure 7:
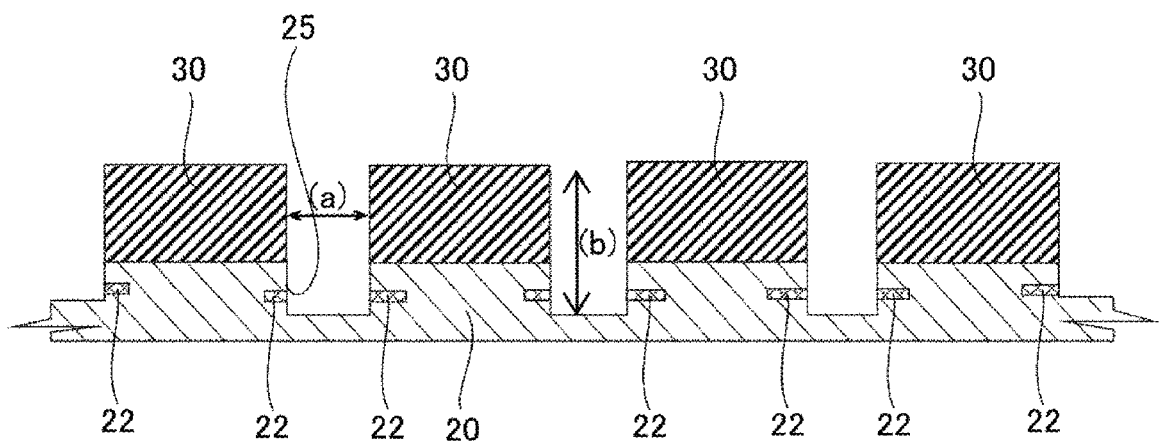
FIG. 7 is a cross-sectional view of a process of manufacturing the electronic component-mounting substrate according to the embodiment.

First, the electronic components 30 are mounted on the substrate 20. FIG. 7 is one example of the substrate at the stage of manufacturing the component-mounting substrate according to this embodiment obtained by the process (a). As shown in FIG. 7, semiconductor chips (not shown) are mounted on the substrate 20, the substrate 20 on which the semiconductor chips are formed is molded by a sealing resin, and the mold resin and the substrate 20 are half cut by dicing or the like from the upper part between the electronic components to the inside of the substrate 20. Another method in which the electronic components 30 are arranged in an array shape on a substrate that has been preliminary half cut may instead be employed. Note that the electronic components 30 mean, in the example shown in FIG. 8, an integrated object in which the semiconductor chips are molded, and mean electronic elements in general protected by an insulator. The half cut may either indicate a form in which the substrate is cut to reach inside the substrate or indicate a form in which it is cut to the surface of the substrate. Further, the entire substrate may be cut at this stage. In this case, it is preferable to place the substrate on a base with adhesive tape so that positional deviation does not occur. In this case, problems of crack and deformation of the base with adhesive tape may occur due to thermal pressing.

The grooves between the electronic components preferably have a grid shape from the viewpoint of preventing unevenness of embedding.

The material of the sealing resin when the semiconductor chips are molded is typically, but not specially limited thereto, a thermosetting resin. The method of forming the sealing resin is not particularly limited and may be printing, laminating, transfer molding, compression, or casting. The molding may be optional and the method of mounting the electronic components may be arbitrarily changed.

<Process (b)>

The process (b) is a process of placing, after the process (a), the electromagnetic wave shielding sheet in which the reinforcement layer, the cushion layer, and the conductive layer are laminated in this order on the electronic components mounted on the substrate in such a way that the conductive layer is opposed to the electronic components.

Figure 8:
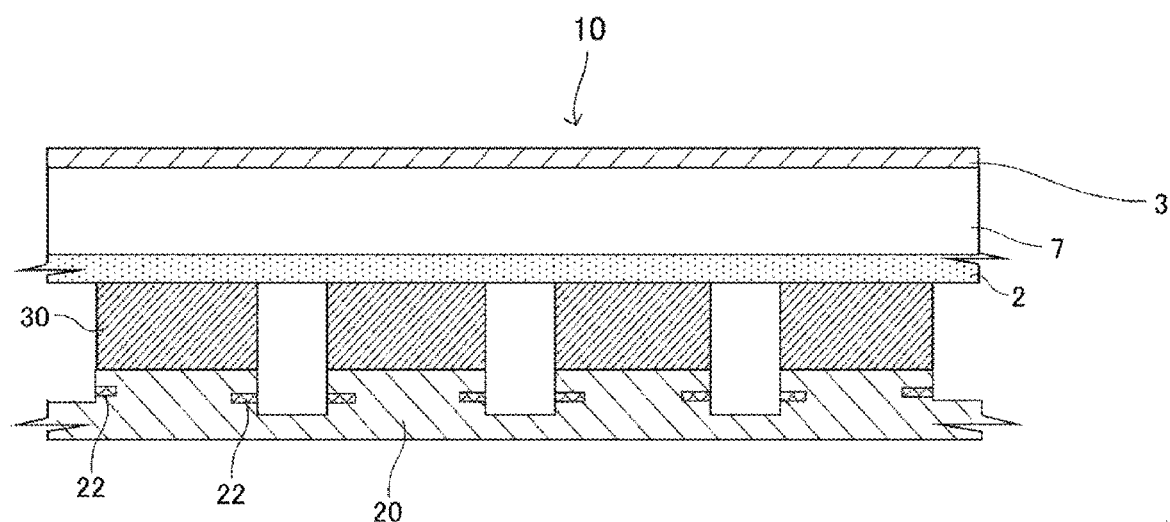
FIG. 8 is a cross-sectional view of the process of manufacturing the electronic component-mounting substrate according to the embodiment.

As shown in FIG. 8, after the process (a), the electromagnetic wave shielding sheet 10 is provided on the electronic components 30 mounted on the substrate 20. The electromagnetic wave shielding sheet 10 is provided in such a way that the conductive layer 2 is opposed to the bonding area with the substrate 20 and the electronic components 30. After the placement, the electromagnetic wave shielding sheet 10 may be temporarily bonded to the electronic components 30.

As a method of temporarily bonding, the electromagnetic wave shielding sheet 10 is placed above the substrate, and the whole surface or the end part of this sheet is thermally pressed lightly using a heat source such as an iron to temporarily bond it. When the whole surface is thermally pressed, an apparatus such as a heat roll laminator for rigid substrates may be used. Depending on the size of the manufacturing facility or the substrate 20 etc., a plurality of electromagnetic wave shielding sheets 10 may be used for each area of the substrate 20 or the electromagnetic wave shielding sheet 10 may be used for each electronic component 30. From the viewpoint of simplifying the manufacturing process, one electromagnetic wave shielding sheet 10 is preferably used for the entire plurality of electronic components 30 mounted on the substrate 20.

<Process (c)>

The process (c) is a process for bonding the electromagnetic wave shielding sheet 10, after the process (b), by thermal pressing in such a way that the conductive layer follows the step parts formed by mounting the electronic components and the exposed surface of the substrate, thereby obtaining the electromagnetic wave shielding layer.

Figure 9:
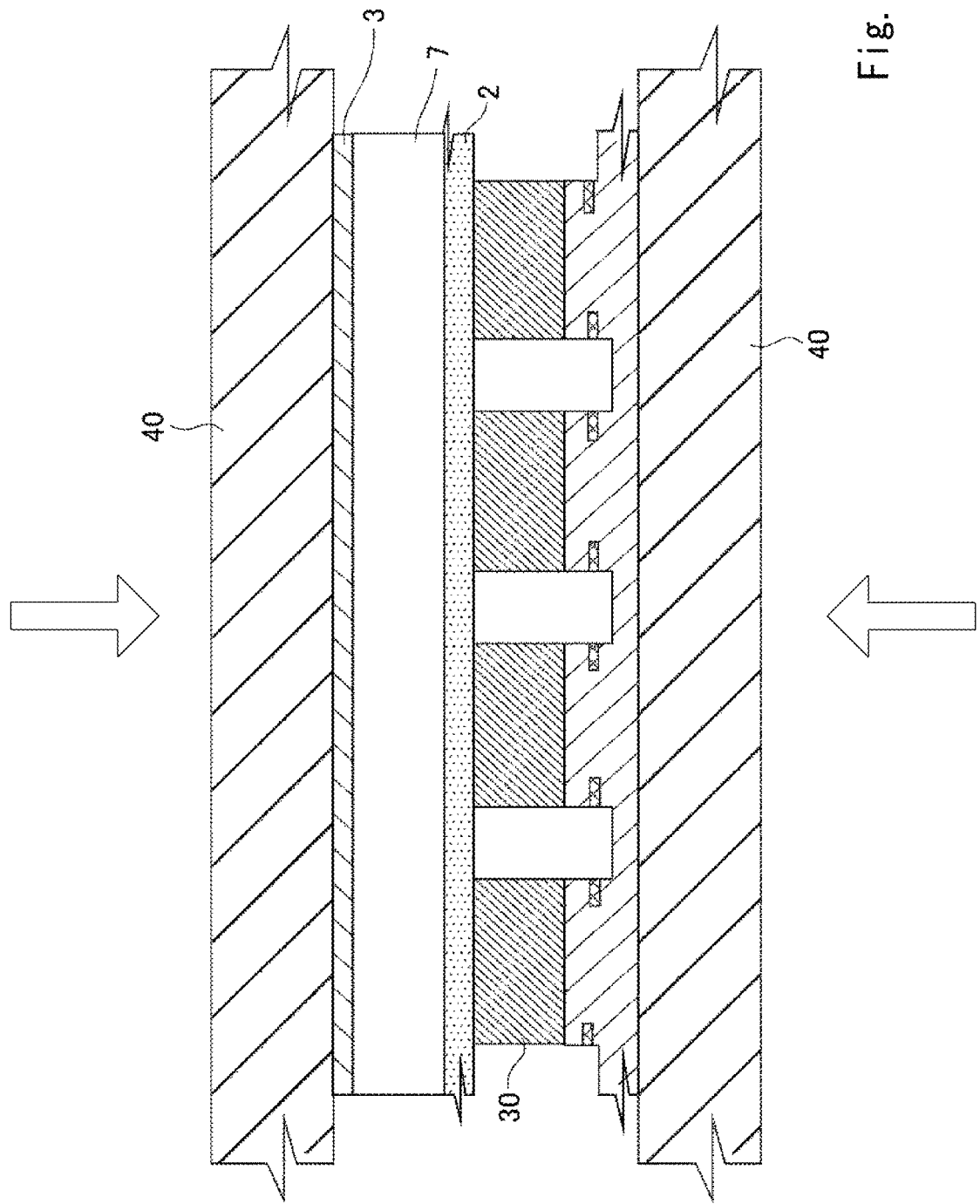
FIG. 9 is a cross-sectional view of the process of manufacturing the electronic component-mounting substrate according to the embodiment.
Figure 10:
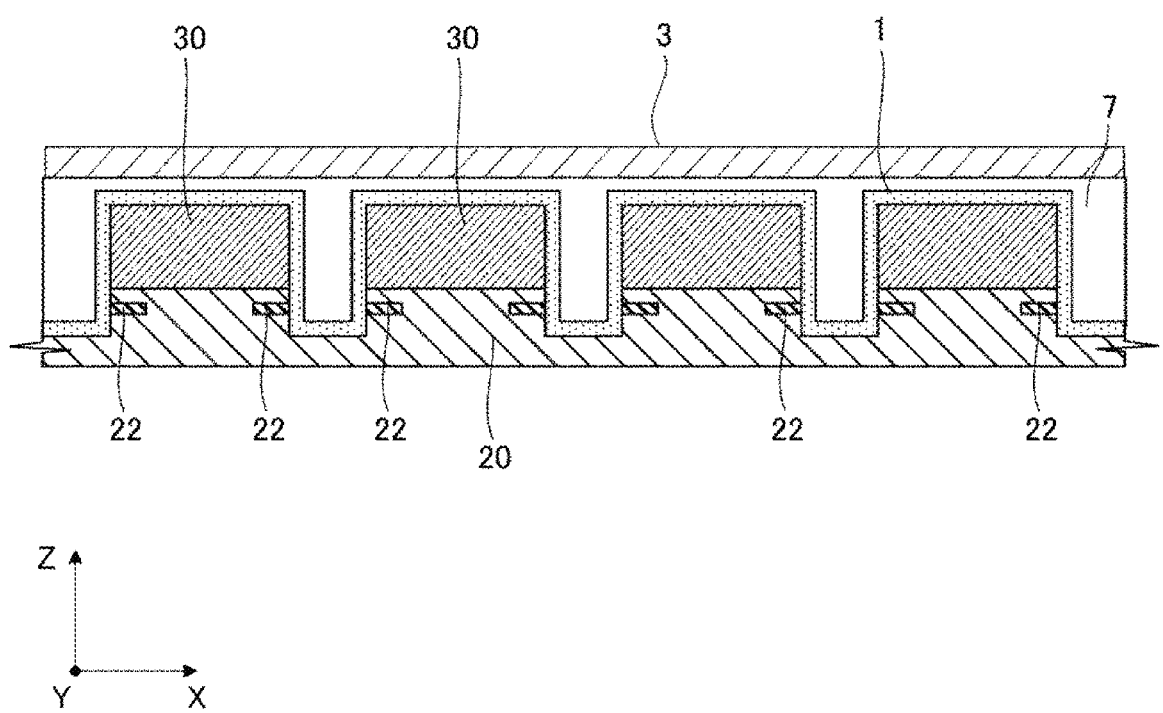
FIG. 10 is a cross-sectional view of the process of manufacturing the electronic component-mounting substrate according to the embodiment.
Figure 11:
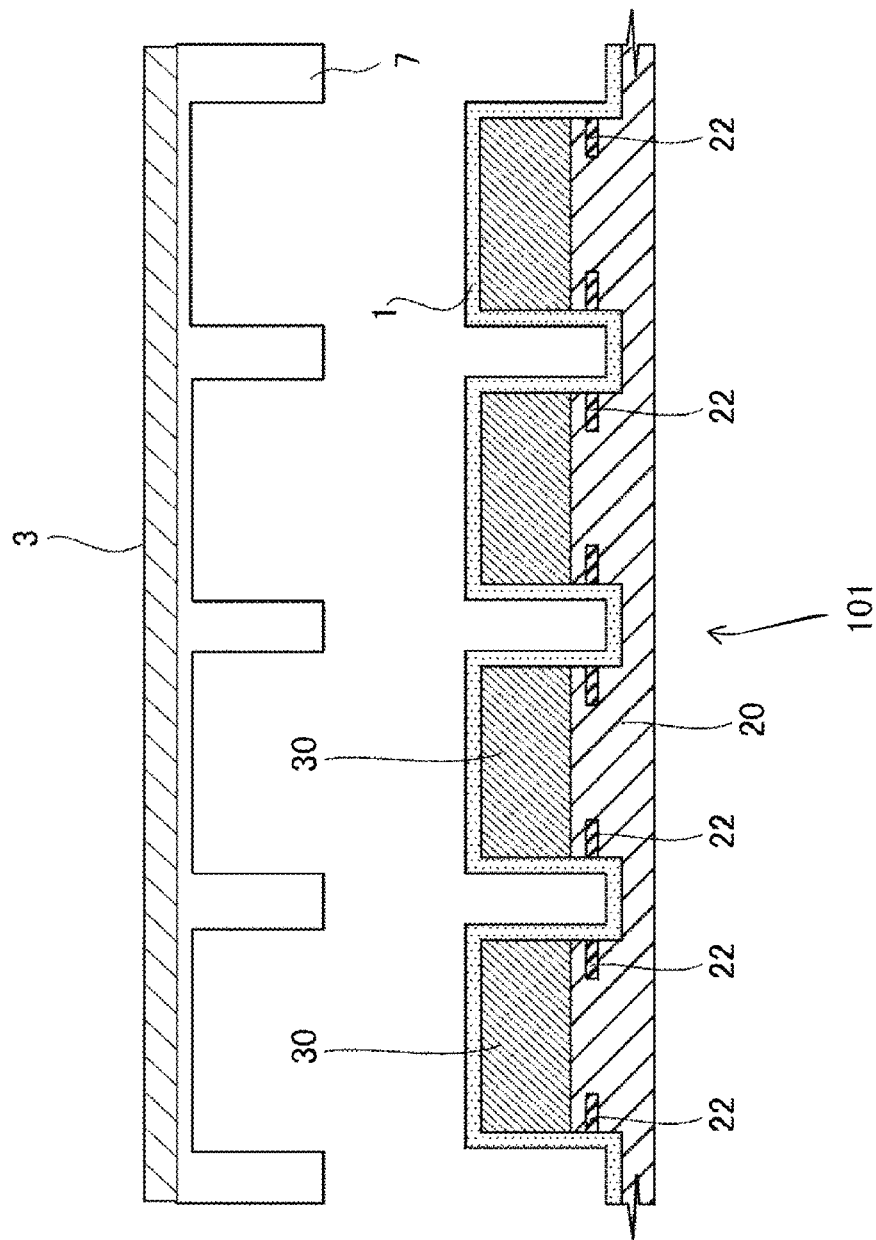
FIG. 11 is a cross-sectional view of the process of manufacturing the electronic component-mounting substrate according to the embodiment.

As shown in FIG. 9, the manufacturing substrate obtained by the manufacturing process (b) is sandwiched between a pair of press substrates 40, and is thermally pressed. The conductive layer 2 is expanded so that it expands along the half-cut grooves 25 provided on the manufacturing substrate by pressing due to melting of the cushion layer 7, and the conductive layer 2 is applied following the electronic components 30 and the substrate 20, whereby the electromagnetic wave shielding layer 1 is formed. By releasing the press substrates 40, the manufacturing substrate as shown in FIG. 10 can be obtained.

The temperature in the thermal pressing process is preferably equal to or higher than the melting temperature of the cushion layer 7 but is smaller than the melting temperature of the reinforcement layer 3. By setting the temperature to this range, it is possible to maintain the strength of the reinforcement layer 3 while melting the cushion layer 7. The heating temperature at the thermal pressing process is preferably 100° C. or higher, more preferably, 110° C. or higher, and further preferably, 120° C. or higher. Further, the upper-limit value, which depends on the heat-resisting property of the electronic components 30, is preferably 220° C. or lower, more preferably, 200° C. or lower, and further preferably, 180° C. or lower.

The pressure at the thermal pressing process can be arbitrarily set within a range in which the coverage of the conductive layer 2 can be secured in accordance with the durability, the manufacturing facility, or the needs of the electronic components 30. The pressure range is preferably, but not limited thereto, about 0.5 to 15.0 MPa, more preferably, 1 to 13.0 MPa, and further preferably, 2 to 10.0 MPa. A protective layer or the like may be provided on the electromagnetic wave shielding layer as appropriate.

The thermal pressing time may be set in accordance with the heat-resisting property of the electronic components, the binder resin used for the conductive layer, the manufacturing process and the like. The thermal pressing time is preferably in a range from about one minute to two hours. The thermal pressing time is, more preferably, about one minute to one hour. When a thermosetting resin is used as the binder resin, the thermosetting resin is cured by this thermal pressing. However, the curing of the thermosetting resin may be completed partially or substantially before thermal pressing if it is flowable.

As the thermal pressing apparatus, a pressing-type thermal pressing apparatus, a transfer molding apparatus, a compression molding apparatus, a vacuum pressure forming apparatus or the like may be used.

The arrows indicating the pressing direction in FIG. 9 are merely one example and the pressing direction is not limited to the vertical direction.

<Process (d)>

The process (d) is a process of removing the cushion layer and the reinforcement layer after the process (c).

Next, the cushion layer 7 and the reinforcement layer 3 that cover the electromagnetic wave shielding layer 1 are peeled off. Accordingly, the component-mounting substrate 101 including the electromagnetic wave shielding layer 1 that covers the electronic components 30 are obtained (see FIGS. 1, 2, and 11).

After the process (d), the component-mounting substrate 101 is diced in positions that correspond to the respective product areas of the component-mounting substrate 101 in the substrate 20 in the XY direction using a dicing blade or the like (see FIG. 2). Accordingly, a component-mounting substrate in which the electronic components 30 are covered with the electromagnetic wave shielding layer 1 can be obtained. Further, a component-mounting substrate in which the ground patterns 22 formed in the substrate 20 and the electromagnetic wave shielding layer are electrically connected to each other can be obtained.

Modified Example 2

While one example of the manufacturing method of applying the electromagnetic wave shielding sheet to the electronic component-mounting substrate on which the electronic components are mounted has been described in the aforementioned embodiment, the electromagnetic wave shielding sheet according to this embodiment can be applied also to an electronic component that does not include a substrate. The electromagnetic wave shielding sheet according to the modified example 2 can use a sheet similar to that in the aforementioned embodiment and the modified example 1. The electronic component can be covered with the electromagnetic wave shielding layer by a method similar to that in the aforementioned embodiment except that the substrate is replaced by a placement table. The electronic component with the electromagnetic wave shielding layer according to the modified example 2 can be manufactured, for example, by the following method.

By directly arranging a plurality of electronic components on a placement table (including a placement substrate or a placement sheet) and thermally pressing the electromagnetic wave shielding sheet according to this embodiment against the exposed surfaces of the electronic components (top surfaces and side surfaces of the electronic components that do not contact the placement table), the electromagnetic wave shielding layer can be collectively formed for a plurality of electronic components. That is, in the modified example 2, by replacing, for example, the substrate 20 in the example shown in FIG. 1 by a placement table, providing the electronic components on the placement table by a method similar to that in the aforementioned embodiment, thermally pressing the electromagnetic wave shielding sheet, and dividing it into pieces as appropriate, the electronic components with the electromagnetic wave shielding layer can be obtained. According to this method, the exposed surfaces of the plurality of electronic components can be collectively covered with the electromagnetic wave shielding layer.

The electronic components may be, for example, electronic components (e.g., QFN packages) in which IC chips are arranged on die pads exposed on a bottom surface, which is a contact surface, of the placement table, a plurality of terminals that are exposed are formed on bottom surfaces and side surfaces, and the whole part thereof is molded by a sealing resin. By using ground terminals as terminals of the side surfaces of the electronic components and coating the top surfaces and the side surfaces of the electronic components with the electromagnetic wave shielding layer, the ground terminals and the electromagnetic wave shielding layer can be electrically connected to each other.

Further, in place of the method of directly arranging the electronic components onto the placement table such as a placement substrate, the electronic components before molding may be arranged or formed on the placement table, and a sealing resin layer (a mold resin layer) may be collectively formed for a plurality of electronic components before molding by a sealing resin. In this case, half-cut grooves are formed in this sealing resin layer so as to define the unit modules. Next, the electromagnetic wave shielding sheet according to the aforementioned embodiment or the modified example 1 is thermally pressed collectively against the plurality of electronic components including the half-cut grooves to coat the top surfaces of the electronic components and the side surfaces of the electronic components formed by the half-cut grooves with the electromagnetic wave shielding layer. After that, the electronic components with the electromagnetic wave shielding layer obtained by dicing and dividing the shielding layer and the sealing resin layer are obtained. According to the method of half-cutting the sealing resin layer, side surfaces of the electronic components in an area that is desired to be covered with the electromagnetic wave shielding layer (e.g., an area where the ground electrodes are formed) may be covered with the electromagnetic wave shielding layer while not coating the side surfaces of the electronic components in an area that is not desired to be covered with the electromagnetic wave shielding layer (e.g., an area where signal electrodes are formed) with the electromagnetic wave shielding layer.

The examples of the aforementioned electronic components are merely examples, and the electromagnetic wave shielding sheets according to this embodiment and the modified example 1 can be applied to various forms. With the use of the electronic component with the electromagnetic wave shielding layer according to the modified example 2, it is possible to provide the electromagnetic wave shielding layer having high embedding properties, ground connectivity, edge covering properties, and PCT resistance for electronic components that do not include a substrate.

[Electronic Device]

The component-mounting substrate according to this embodiment can be mounted, for example, on the mounting substrate via solder balls or the like formed on the rear surface of the substrate 20, and can be mounted on the electronic device. For example, the component-mounting substrate according to this embodiment can be used for various electronic devices such as a personal computer, tablet terminal, smartphone, and a drone.

EXAMPLES

While the present disclosure will be described in further detail with reference to Examples, the present disclosure is not limited to the following Examples. Further, the term "part" in Examples indicates "pts·mass" and "%" means "mass %". Further, the values described in this Example have been obtained by the following method.

(1) Manufacturing of Testing Board

A substrate on which electronic components sealed by molding are mounted in an array shape was prepared on a substrate made of glass epoxy. The thickness of the substrate was 0.3 mm and the mold sealing thickness, that is, the height (component height) H from the upper surface of the substrate to the top surface of the mold sealing material was 0.7 mm. After that, the substrate was subjected to half dicing along grooves, which are gaps between the components, thereby obtaining a testing board (see FIG. 12). The depth of the half-cut grooves was 0.8 mm (the depth of the cut grooves of the substrate 20 was 0.1 mm), and the width of the half-cut grooves was 0.2 mm.

Figure 12:
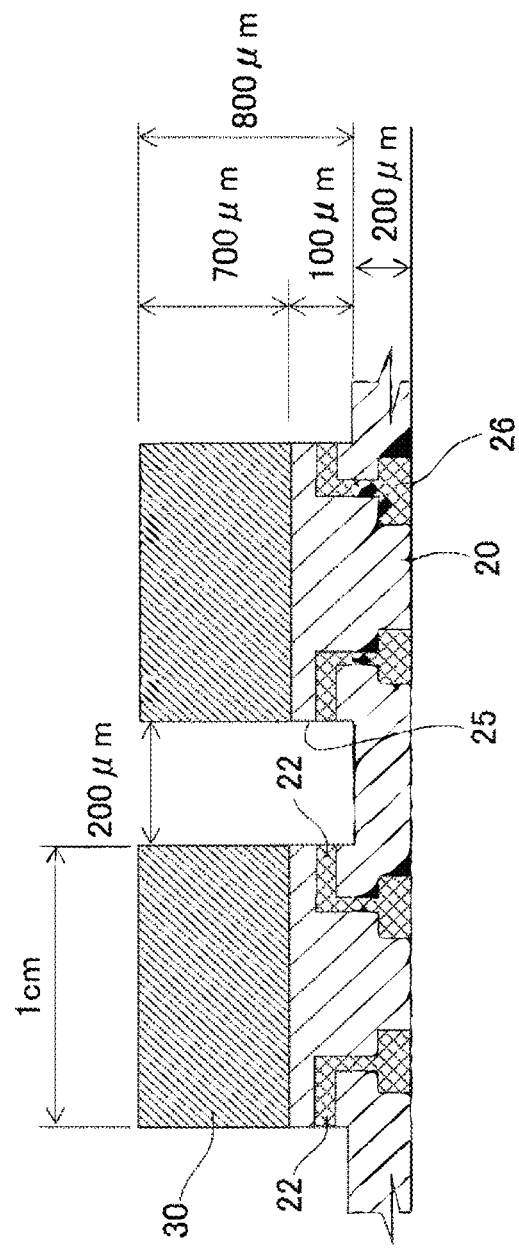
FIG. 12 is a schematic cross-sectional view showing another example of an electronic component-mounting substrate according to an Example.

FIG. 12 shows a schematic cross-sectional view of the testing board.

The materials used in the Examples will be shown below.
Binder resin 1: polyurethane resin, acid value 10 [mgKOH/g] (manufactured by TOYOCHEM CO., LTD.)
Binder resin 2: polycarbonate resin, acid value 5 [mgKOH/g] (manufactured by TOYOCHEM CO., LTD.)
Binder resin 3: styrene resin, acid value 11 [mgKOH/g] (manufactured by TOYOCHEM CO., LTD.)
Binder resin 4: phenoxy resin, acid value 15 [mgKOH/g] (manufactured by TOYOCHEM CO., LTD.)
Curable compound 1: epoxy resin, "Denacol EX830" (bi-functional epoxy resin, epoxy equivalent=268 g/eq) Nagase ChemteX Corporation
Curable compound 2: epoxy resin, "YX8000" (hydrogenated bisphenol epoxy resin, epoxy equivalent=210 g/eq) manufactured by Mitsubishi Chemical Corporation
Curable compound 3: epoxy resin, "jER157S70" (bisphenol A novolac epoxy resin, epoxy equivalent=208 g/eq) manufactured by Mitsubishi Chemical Corporation
Hardening accelerator: aziridine compounds, "Chemitite PZ-33" (manufactured by NIPPON SHOKUBAI CO., LTD.)
Conductive filler 1: scaly particles made of silver (average particle diameter D50=6.0 μm, thickness 0.8 μm)
Radio wave absorption filler 1: Fe—Si—Cr scaly magnetic particles (average particle diameter D50:9.8 μm, thickness 0.5 μm)
Radio wave absorption filler 2: Fe—Co scaly magnetic particles (average particle diameter D50:13 μm, thickness 0.6 μm)
Radio wave absorption filler 3: carbon nanotube (CNT) particles (average particle diameter D50:15 μm, thickness 0.9 μm)
Releasable base: a PET film having a thickness of 50 μm whose surface is coated with a silicone releasing agent <Measurement of Young's Modulus at Temperatures of 23° C. and 80° C.>

The sheet A and the sheet C were bonded to each other in accordance with the methods described later in Examples 1-29 and comparative examples 1 and 2 and they were aged for times shown in Tables 1~4 by an oven heated to 100° C., thereby obtaining a laminate. After that, the sheet C was peeled off from the laminate and the releasable base was finally peeled off, thereby obtaining a conductive layer.

The conductive layer that has been left to stand at 23° C. and a relative humidity of 50% for 24 hours was placed in a constant temperature and humidity environment at 23° C. and a relative humidity of 50%, and the stress-strain curve of the conductive layer was measured by a tensile tester "EZ tester" (manufactured by Shimadzu Corporation) under conditions of a tensile speed of 50 mm/min and a bench mark of 25 mm, and the linear regression (inclination) in an area in which the distortion (elongation) was 0.1 to 0.3% was determined to be the Young's modulus at 23° C. Another chamber was prepared and the stress-strain curve was measured under a condition of 80° C. in a manner similar to that stated above, whereby the Young's modulus at 80° C. was measured.

<Measurement of Curing Degree>

The conductive layer was obtained by a method similar to that in the sample used for the measurement of the Young's modulus described above.

A 100-mesh wire netting was cut into a size of a width of 30 mm and a length of 100 mm to measure the weight (W1). Then, a conductive layer having a width of 10 mm and a length of 80 mm was wrapped with the aforementioned wire netting to form a test piece, and the weight (W2) thereof was measured. The manufactured test piece was immersed into methyl ethyl ketone at room temperature for one hour, the test piece was removed from the solvent, the removed test piece was dried at 100° C. for 30 minutes, and then the weight (W3) thereof was measured. The content ratio of the conductive layer that remains in the wire netting without being dissolved was calculated as a curing degree using the following calculation formula [I]. In this Example, it has been confirmed that among a single or mixed solvent selected from methyl ethyl ketone, toluene, isopropyl alcohol, and chloroform, methyl ethyl ketone achieves the highest solubility of the conductive layer.

$$(W3-W1)/(W2-W1) \times 100 [\%] \quad [I]$$

<Measurement of Thickness>

Regarding the thickness of the electromagnetic wave shielding layer, the cross section of the component-mounting substrate was exposed by a polishing method, and the film thickness of a part that has the largest thickness on the upper surface area of the electronic component was measured by a laser microscope. The film thicknesses of five different samples of the exposed cross sections of component-mounting substrates were measured in a similar way and the average value thereof was determined to be a thickness.

Regarding the thicknesses of the respective layers that form a laminate, the film thicknesses of five different parts were measured using a contact-type film thickness meter and the average value thereof was used as a thickness.

<Thickness of Conductive Filler and Radio Wave Absorption Filler>

About 10 to 20 different particles were measured based on an image obtained by enlarging the image of the cut surface whose thickness of the electromagnetic wave shielding layer was measured by about 1,000 to 50,000 times using an electron microscope, and the average value thereof was used.

<Average Particle Diameter $D_{50}$>

The average particle diameter $D_{50}$ is a numerical value of the average particle diameter $D_{50}$ obtained by measuring the particle diameters of the conductive filler, the radio wave absorption filler, or the inorganic filler by a tornado dry powder sample module using a laser diffraction scattering particle size distribution measurement deice LS 13320 (manufactured by Beckman Coulter), and is a particle diameter whose cumulative value in the particle diameter cumulative distribution is 50%. The type of distribution was volume distribution and the refractive index was 1.6. It is sufficient that the particles have the aforementioned particle diameter and may either be primary particles or secondary particles.

<Glass Transition Temperature (Tg)>

Each of the layers that compose the laminate was subjected to a measurement process under conditions of deformation form "pulling", the frequency of 10 Hz, a temperature rising rate of 10° C./min, and a measurement temperature range of −80° C. to 300° C. using a dynamic viscoelasticity analyzer DVA-200 (manufactured by I.T. Keisoku Seigyo Co., Ltd.), thereby obtaining the glass transition temperature (Tg).

The glass transition temperature (Tg) of the conductive layer and the glass transition temperature (Tg) of the layer obtained by heating the conductive layer at 180° C. for two hours were obtained.

<Measurement of Acid Value>

Approximately 1 g of a thermosetting resin was precisely weighed and put into an Erlenmeyer flask with stopper and dissolved by the addition of 50 mL of a toluene/ethanol (volume ratio: toluene/ethanol=2/1) mixed solution. A phenolphthalein reagent was added thereto as an indicator, and the solution was retained for 30 seconds. Then, the solution was titrated with a 0.1 mol/L alcoholic potassium hydroxide solution until the solution exhibited a rose-pink color. The acid value was determined according to the expression given below. The acid value was a numerical value in a dry state of the resin.

$$\text{Acid value(mgKOH/g)} = (a \times F \times 56.1 \times 0.1)/S$$

S: Amount of the sample collected×(Percent solids of the sample/100) (g)
a: Titrated amount with the 0.1 mol/L alcoholic potassium hydroxide solution (mL)
F: Titer of the 0.1 mol/L alcoholic potassium hydroxide solution Example 1

70 parts of binder resin 1 (percent solids), 30 parts of binder resin 2 (percent solids), 30 parts of curable compound 1, 15 parts of curable compound 2, 1 part of hardening accelerator 1, and 320 parts of conductive filler 1 were put into a vessel, a mixed solvent of toluene:isopropyl alcohol (mass ratio of 2:1) was added in such a way that the nonvolatile content concentration became 45 mass %, and stirred with a disper for ten minutes, thereby obtaining a conductive resin composition.

The above conductive resin composition was applied to the releasable base using a doctor blade in such a way that the dry thickness becomes 50 μm. Then the obtained substrate was dried at 100° C. for two minutes to thereby obtain a sheet A in which the releasable base and the conductive layer are laminated to each other.

In addition, an acrylic tackifier layer having a thickness of 9 μm (Tg was −40° C., manufactured by TOYOCHEM CO., LTD.) was formed as an anchor layer on a PET film having a thickness of 50 μm, which is a reinforcement layer, ("Tetoron G2" manufactured by TEIJIN LIMITED), and the obtained layer was bonded to one surface side of "Opulent CR1012MT4 (thickness of the layer: 150 μm)" manufactured by Mitsui Chemicals Tohcello. Inc. made from polymethylpentene provided on the both surfaces of a thermofusion resin layer as a cushion layer on the tackifier layer surface, thereby obtaining a sheet C.

Next, the surface of the conductive layer of the sheet A and the surface of the cushion layer of the sheet C were bonded to each other by a roll laminator and the bonded layer was subjected to aging in an oven at 100° C. for six minutes, thereby obtaining a laminate.

The obtained laminate was cut into a size of 10 cm×10 cm, the releasable base was peeled off, and the conductive layer was placed onto a testing board. After that, the substrate surface was thermally pressed from the upper side of the reinforcement layer of the laminate for five minutes under conditions of 5 MPa and 170° C. After the sample was thermally pressed and then cooled, the reinforcement layer and the cushion layer were concurrently peeled off, and the obtained substrate was further heated at 180° C. for two hours, thereby obtaining the electronic component-mounting substrate in which the electromagnetic wave shielding layer was formed.

Examples 2-29 and Comparative Examples 1-2

The component-mounting substrate was manufactured in a way similar to that in Example 1 except that the Young's modulus of the conductive layer at 23° C. and other physical properties, each component and the content amount (pts·mass), the width and the depth of the grooves of the electronic components on the testing board were changed to those shown in Tables 1-4. The content amount of the binder resin and the curable compound shown in Tables 1-4 is a mass of the solid content.

The above Examples and comparative examples were evaluated by the following measurement methods and evaluation criteria.

<Evaluation of Embedding Properties>

The embedding properties of the component-mounting substrates obtained in Examples 1-29 and comparative examples 1-2 were evaluated by forming the cross sections as shown in FIG. 2 along the line II-II in FIG. 1 by a polishing method and observing ten parts of the cross sections of the electromagnetic wave shielding layer of the half-cut grooves 25 by an electron microscope.

The evaluation criteria are as follows.

+++: All the grooves were embedded. Extremely good results.

++: Nine grooves were embedded. Good results.

+: Eight grooves were embedded. No problem in practical use.

NG: The number of grooves embedded was seven or smaller. Cannot be practically used.

<Ground Connectivity>

Figure 15:
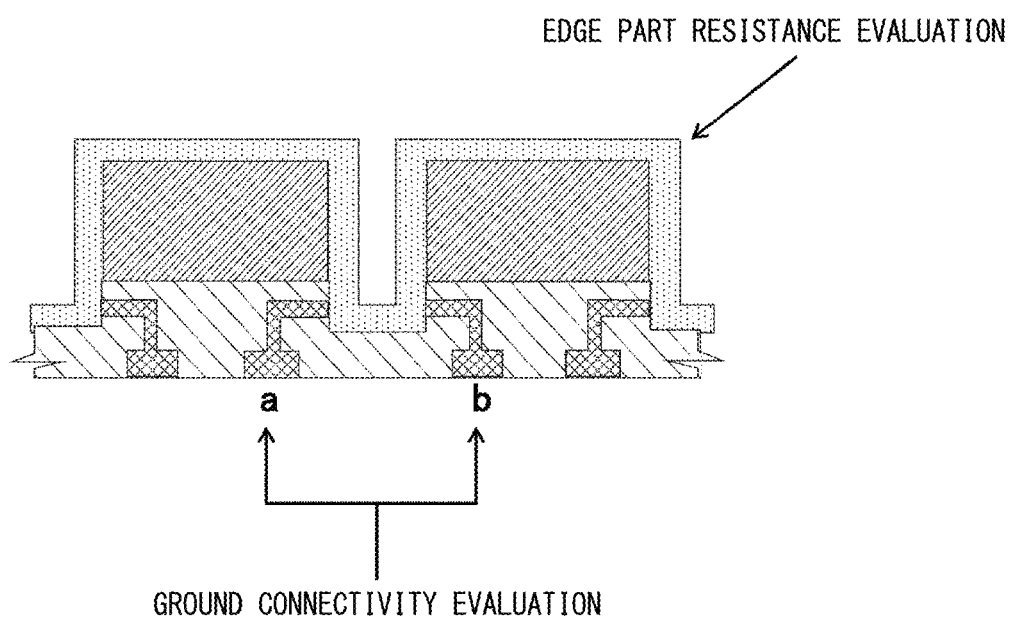
FIG. 15 is a schematic cross-sectional view showing a method of evaluating the component-mounting substrate according to the Example.
Figure 16:
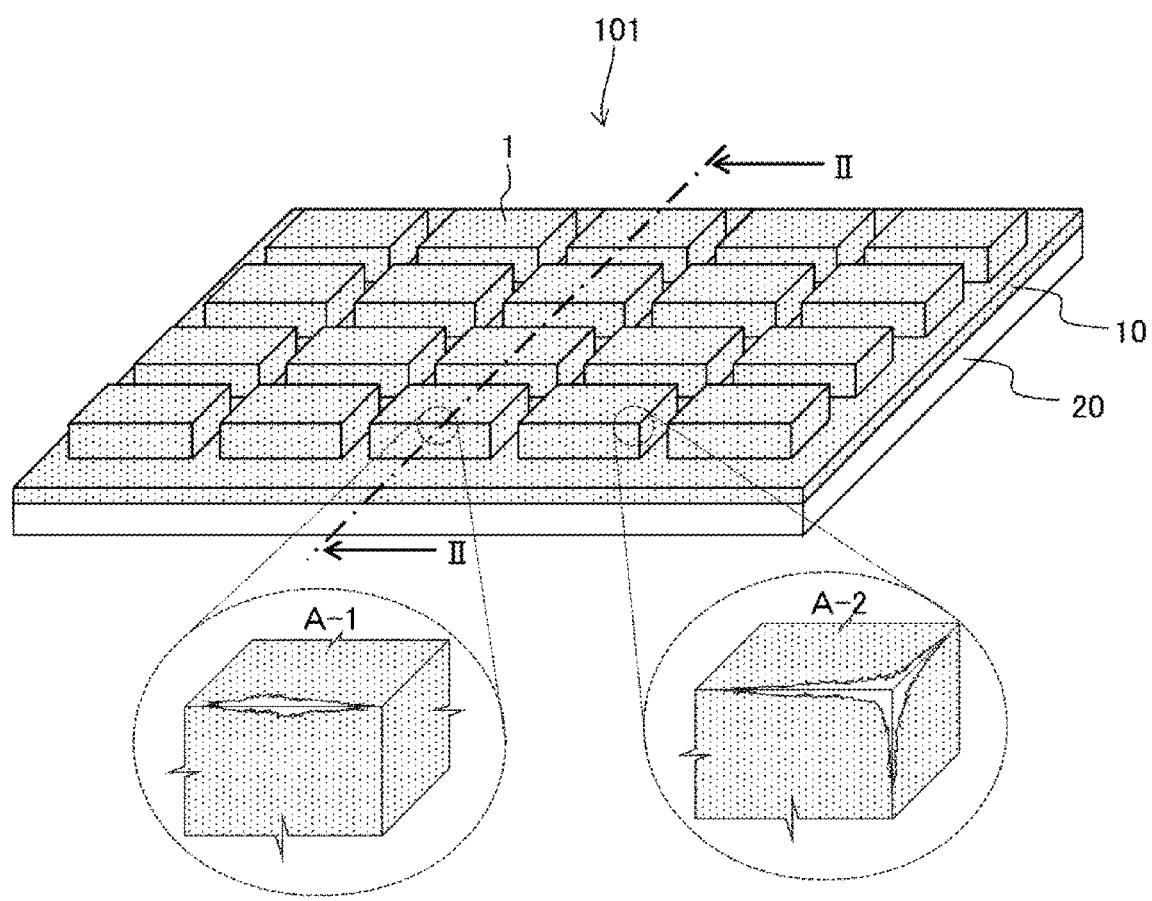
FIG. 16 is a schematic perspective view showing one example of an electronic component-mounting substrate in which an electromagnetic wave shielding layer is formed of an electromagnetic wave shielding sheet according to related art.
Figure 17:
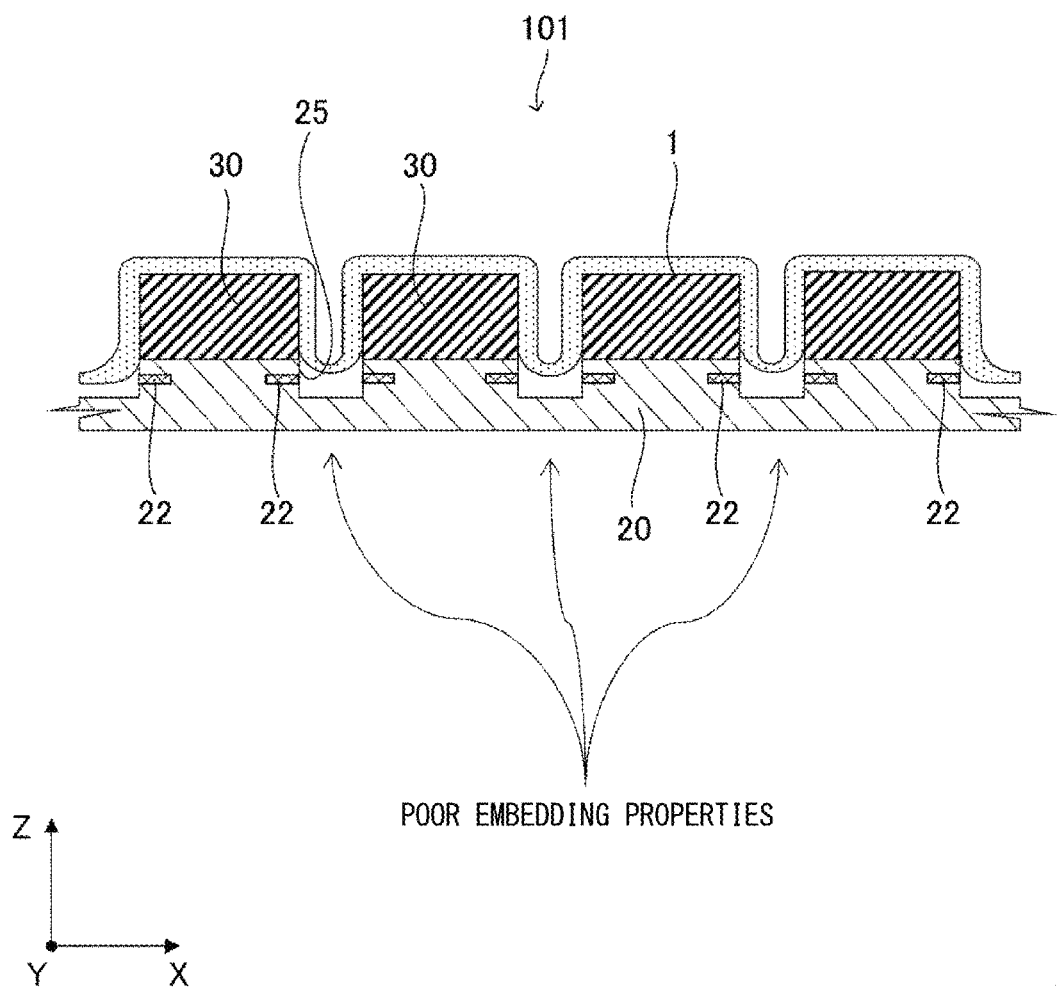
FIG. 17 is one example of poor embedding properties.
Figure 18:
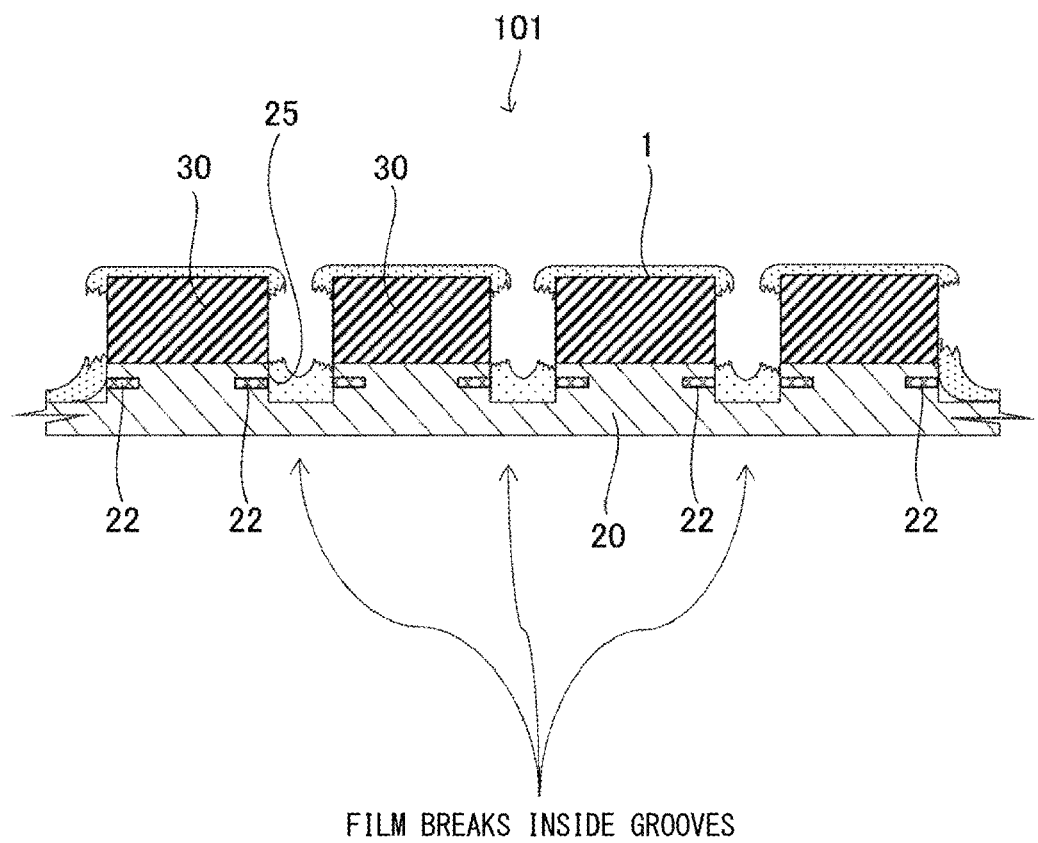
FIG. 18 is one example of poor embedding properties.

The ground connectivities of the component-mounting substrates obtained in Examples 1-29 and comparative examples 1-2 were evaluated by measuring the connection resistance value between the ground terminals a and b of the bottom part shown in the cross-sectional view in FIG. 15 using RM3544 manufactured by HIOKI E.E. CORPORATION and a pin-type lead probe.

The evaluation criteria are as follows.

+++: The connection resistance value was smaller than 200 mΩ. Extremely good results.

++: The connection resistance value was 200 mΩ greater but smaller than 500 mΩ. Good results.

+: The connection resistance value was 500 mΩ greater but smaller than 1000 mΩ. No problem in practical use.

NG: The connection resistance value was 1000 mΩ greater. Cannot be practically used.

<Edge Covering Properties>

The breaks of the edge parts of the component-mounting substrate shown in FIG. 15 were observed by a microscope and evaluated. Edge parts at four different points have been observed and evaluated.

The evaluation criteria are as follows.

+++: No break. Extremely good results.

++: The electromagnetic wave shielding layer was partially transparent. Good results.

+: The edges were partially broken and the electronic components were exposed. No problem in practical use.

NG: The entire edges were broken and the whole parts of the electronic components were exposed. Cannot be practically used.

<PCT Resistance>

An FR4 (glass epoxy substrate) was prepared, the aforementioned laminate was cut into a size of 10 cm×10 cm, the releasable base was peeled off, and the conductive layer was placed onto the FR4. After that, the FR4 surface was thermally pressed from the upper side of the reinforcement layer of the laminate for 20 minutes under conditions of 5 MPa and 160° C. After the thermal pressing, the obtained sample was cooled, the reinforcement layer and the cushion layer were concurrently peeled off, thereby obtaining a testing board in which the electromagnetic wave shielding layer was formed. Next, this testing board was subjected to Pressure Cooker Test (conditions: 130° C., 85% RH, 0.12 MPa, and 96 hours). After that, and 100 grids having a spacing of 1 mm were formed to the electromagnetic wave shielding layer of the testing board in compliance with JIS K 5400 using a cross cut guide. After that, an adhesive tape (CELLOTAPE (registered trademark) CT-18 manufactured by NICHIBAN Co., Ltd.) was strongly pressed to the grid part, the end of the tape was peeled off all at once at an angle of 45°, and the state of the grids was judged according to the following criteria.

+++: The peeling rate was smaller than 15%.

++: The coating film was partially peeled off along the cut line. The peeling rate was 15% or greater but smaller than 20%.

+: The coating film was partially peeled off along the cut line. The peeling rate was 20% or greater but smaller than 35%.

NG: The coating film was peeled off along the cut line partially or entirely. The peeling rate was 35% or greater.

Tables 1-4 show the results of the evaluations of the component-mounting substrate according to the Examples and comparative examples.

[Table 1]

TABLE 1

| | | Example 1 | Example 2 | Example 3 | Example 4 | Example 5 | Example 6 | Example 7 | Example 8 |
|---|---|---|---|---|---|---|---|---|---|
| Conductive layer | Binder resin 1 | 70 | 50 | 50 | | 20 | 50 | 50 | 20 |
| | Binder resin 2 | 30 | 50 | 50 | 20 | | 50 | 50 | 80 |
| | Binder resin 3 | | | | 80 | | | | |
| | Binder resin 4 | | | | | 80 | | | |
| | Curable compound 1 | 30 | 20 | 10 | 20 | 20 | 10 | | |
| | Curable compound 2 | 15 | 15 | 25 | 15 | 15 | 25 | 30 | 20 |
| | Curable compound 3 | | | 10 | 10 | 10 | 25 | 30 | 40 |
| | Curing accelerator | 1 | 1 | 1 | 1 | 1 | 1 | 1 | 1 |
| | Conductive filler 1 | 320 | 320 | 320 | 320 | 320 | 320 | 320 | 320 |
| | Radio wave absorption filler 1 | | | | | | | | |
| | Radio wave absorption filler 2 | | | | | | | | |
| | Radio wave absorption filler 3 | | | | | | | | |
| | 100° C. Aging time [min] | 6 | 6 | 6 | 6 | 6 | 6 | 6 | 6 |
| Film properties | Young's modulus at 23° C. [MPa] | 11 | 32 | 51 | 77 | 129 | 275 | 396 | 682 |
| | Young's modulus at 80° C. [MPa] | 6 | 10 | 13 | 18 | 32 | 40 | 61 | 80 |
| | Rate of Young's modulus (23° C./80° C.) | 1.8 | 3.2 | 3.9 | 4.3 | 4.0 | 6.9 | 6.5 | 8.5 |
| | Tg of conductive layer [° C.] | −13 | −9 | −5 | 0 | 20 | 19 | 21 | 30 |
| | Tg after conductive layer is heated at 180° C. for two hours [° C.] | 18 | 21 | 25 | 43 | 55 | 54 | 65 | 80 |
| | Curing degree [%] | 86 | 86 | 86 | 86 | 86 | 86 | 86 | 86 |
| | Thickness of conductive layer [μm] | 50 | 50 | 50 | 50 | 50 | 50 | 50 | 50 |
| Adherend | Groove width [μm] | 200 | 200 | 200 | 200 | 200 | 200 | 200 | 200 |
| | Groove depth [μm] | 800 | 800 | 800 | 800 | 800 | 800 | 800 | 800 |
| | Groove depth/groove width | 4 | 4 | 4 | 4 | 4 | 4 | 4 | 4 |
| Performance evaluation | Embedding properties | + | +++ | +++ | +++ | +++ | +++ | ++ | ++ |
| | Ground connectivity | ++ | ++ | +++ | +++ | +++ | +++ | +++ | ++ |
| | Edge covering properties | +++ | +++ | +++ | +++ | +++ | +++ | +++ | +++ |
| | PCT resistance | + | ++ | +++ | +++ | +++ | +++ | +++ | +++ |

TABLE 2

| | | Example 9 | Example 10 | Example 11 | Example 12 | Example 13 | Example 14 | Example 15 |
|---|---|---|---|---|---|---|---|---|
| Conductive layer | Binder resin 1 | 50 | 50 | 50 | 50 | 50 | 50 | 50 |
| | Binder resin 2 | 50 | 50 | 50 | 50 | 50 | 50 | 50 |
| | Binder resin 3 | | | | | | | |
| | Binder resin 4 | | | | | | | |
| | Curable compound 1 | 10 | 10 | 10 | 10 | 10 | 10 | 10 |
| | Curable compound 2 | 25 | 25 | 25 | 25 | 25 | 25 | 25 |
| | Curable compound 3 | 25 | 25 | 25 | 25 | 25 | 25 | 25 |
| | Curing accelerator | 1 | 1 | — | 1 | 1 | 1 | 1 |
| | Conductive filler 1 | 320 | 320 | 320 | 320 | 320 | 320 | 320 |
| | Radio wave absorption filler 1 | | | | | | | |
| | Radio wave absorption filler 2 | | | | | | | |
| | Radio wave absorption filler 3 | | | | | | | |
| | 100° C. Aging time [min] | 3 | 3.5 | 4 | 5 | 60 | 120 | 240 |
| Film properties | Young's modulus at 23° C. [MPa] | 198 | 224 | 243 | 256 | 287 | 289 | 291 |
| | Young's modulus at 80° C. [MPa] | 41 | 40 | 39 | 43 | 42 | 42 | 41 |
| | Rate of Young's modulus (23° C./80° C.) | 4.8 | 5.6 | 6.2 | 6.0 | 6.8 | 6.9 | 7.1 |
| | Tg of conductive layer [° C.] | 12 | 14 | 15 | 18 | 19 | 19 | 19 |
| | Tg after conductive layer is heated at 180° C. for two hours [° C.] | 35 | 35 | 35 | 35 | 35 | 35 | 35 |
| | Curing degree [%] | 56 | 61 | 66 | 74 | 97 | 98 | 99 |
| | Thickness of conductive layer [μm] | 50 | 50 | 50 | 50 | 50 | 50 | 50 |
| Adherend | Groove width [μm] | 200 | 200 | 200 | 200 | 200 | 200 | 200 |
| | Groove depth [μm] | 800 | 800 | 800 | 800 | 800 | 800 | 800 |
| | Groove depth/groove width | 4 | 4 | 4 | 4 | 4 | 4 | 4 |
| Performance evaluation | Embedding properties | +++ | +++ | +++ | +++ | +++ | ++ | ++ |
| | Ground connectivity | +++ | +++ | +++ | +++ | +++ | ++ | ++ |
| | Edge covering properties | + | ++ | | +++ | +++ | +++ | +++ |
| | PCT resistance | +++ | +++ | +++ | +++ | +++ | +++ | +++ |

TABLE 3

|  |  | Example 16 | Example 17 | Example 18 | Example 19 | Example 20 | Example 21 | Example 22 |
|---|---|---|---|---|---|---|---|---|
| Conductive layer | Binder resin 1 | 50 | 50 | 50 | 50 | 50 | 50 | 50 |
|  | Binder resin 2 | 50 | 50 | 50 | 50 | 50 | 50 | 50 |
|  | Binder resin 3 |  |  |  |  |  |  |  |
|  | Binder resin 4 |  |  |  |  |  |  |  |
|  | Curable compound 1 | 10 | 10 | 10 | 10 | 10 | 10 | 10 |
|  | Curable compound 2 | 25 | 25 | 25 | 25 | 25 | 25 | 25 |
|  | Curable compound 3 | 25 | 25 | 25 | 25 | 25 | 25 | 25 |
|  | Curing accelerator | 1 | 1 | 1 | 1 | 1 | 1 | 1 |
|  | Conductive filler 1 | 320 | 320 | 320 | 320 | 320 | 320 | 320 |
|  | Radio wave absorption filler 1 |  |  |  |  |  |  |  |
|  | Radio wave absorption filler 2 |  |  |  |  |  |  |  |
|  | Radio wave absorption filler 3 |  |  |  |  |  |  |  |
|  | 100° C. Aging time [min] | 6 | 6 | 6 | 6 | 6 | 6 | 6 |
| Film properties | Young's modulus at 23° C. [MPa] | 275 | 275 | 275 | 275 | 275 | 275 | 275 |
|  | Young's modulus at 80° C. [MPa] | 40 | 40 | 40 | 40 | 40 | 40 | 40 |
|  | Rate of Young's modulus (23° C./80° C.) | 6.9 | 6.9 | 6.9 | 6.9 | 6.9 | 6.9 | 6.9 |
|  | Tg of conductive layer [° C.] | 19 | 19 | 19 | 19 | 19 | 19 | 19 |
|  | Tg after conductive layer is heated at 180° C. for two hours [° C.] | 35 | 35 | 35 | 35 | 35 | 35 | 35 |
|  | Curing degree [%] | 86 | 86 | 86 | 86 | 86 | 86 | 86 |
|  | Thickness of conductive layer [μm] | 12 | 16 | 20 | 70 | 80 | 90 | 100 |
| Adherend | Groove width [μm] | 200 | 200 | 200 | 200 | 200 | 200 | 200 |
|  | Groove depth [μm] | 800 | 800 | 800 | 800 | 800 | 800 | 800 |
|  | Groove depth/groove width | 4 | 4 | 4 | 4 | 4 | 4 | 4 |
| Performance evaluation | Embedding properties | + |  | +++ | +++ | +++ | +++ | +++ |
|  | Ground connectivity | + | + | +++ | +++ | +++ | +++ | +++ |
|  | Edge covering properties | + | ++ | +++ | +++ | +++ | +++ | +++ |
|  | PCT resistance | +++ | +++ | +++ | +++ | +++ | +++ | +++ |

[Table 4]

TABLE 4

|  |  | Example 23 | Example 24 | Example 25 | Example 26 | Example 27 | Example 28 | Example 29 | Comparative Example 1 | Comparative Example 2 |
|---|---|---|---|---|---|---|---|---|---|---|
| Conductive layer | Binder resin 1 | 50 | 50 | 50 | 50 | 50 | 50 | 50 | 100 |  |
|  | Binder resin 2 | 50 | 50 | 50 | 50 | 50 | 50 | 50 |  | 100 |
|  | Binder resin 3 |  |  |  |  |  |  |  |  |  |
|  | Binder resin 4 |  |  |  |  |  |  |  |  |  |
|  | Curable compound 1 | 10 | 10 | 10 | 10 | 10 | 10 | 10 | 30 |  |
|  | Curable compound 2 | 25 | 25 | 25 | 25 | 25 | 25 | 25 | 10 | 10 |
|  | Curable compound 3 | 25 | 25 | 25 | 25 | 25 | 25 | 25 |  | 50 |
|  | Curing accelerator | 1 | 1 | 1 | 1 | 1 | 1 | 1 | 1 | 1 |
|  | Conductive filler 1 | 320 | 320 | 320 | 320 |  |  |  | 320 | 320 |
|  | Radio wave absorption filler 1 |  |  |  |  | 320 |  |  |  |  |
|  | Radio wave absorption filler 2 |  |  |  |  |  | 320 |  |  |  |
|  | Radio wave absorption filler 3 |  |  |  |  |  |  | 100 |  |  |
|  | 100° C. Aging time [min] | 6 | 6 | 6 | 6 | 6 | 6 | 6 | 6 | 6 |
| Film properties | Young's modulus at 23° C. [MPa] | 275 | 275 | 275 | 275 | 275 | 275 | 275 | 9 | 720 |
|  | Young's modulus at 80° C. [MPa] | 40 | 40 | 40 | 40 | 40 | 40 | 40 | 3 | 86 |
|  | Rate of Young's modulus (23° C./80° C.) | 6.9 | 6.9 | 6.9 | 6.9 | 6.9 | 6.9 | 6.9 | 3.0 | 8.4 |
|  | Tg of conductive layer [° C.] | 19 | 19 | 19 | 19 | 19 | 19 | 19 | −16 | 32 |
|  | Tg after conductive layer is heated at 180° C. for two hours [° C.] | 35 | 35 | 35 | 35 | 35 | 35 | 35 | −6 | 89 |
|  | Curing degree [%] | 86 | 86 | 86 | 86 | 86 | 86 | 86 | 86 | 86 |
|  | Thickness of conductive layer [μm] | 50 | 50 | 50 | 50 | 50 | 50 | 50 | 50 | 50 |
| Adherend | Groove width [μm] | 200 | 175 | 150 | 300 | 200 | 200 | 200 | 200 | 200 |
|  | Groove depth [μm] | 1000 | 1000 | 1000 | 400 | 800 | 800 | 800 | 800 | 800 |
|  | Groove depth/groove width | 5 | 6 | 7 | 1 | 4 | 4 | 4 | 4 | 4 |
| Performance evaluation | Embedding properties | +++ | ++ | ++ | +++ | +++ | +++ | +++ | NG | NG |
|  | Ground connectivity | +++ | ++ | + | +++ | +++ | +++ | +++ | NG | NG |
|  | Edge covering properties | +++ | +++ | +++ | +++ | +++ | +++ | +++ | + | +++ |
|  | PCT resistance | +++ | +++ | +++ | +++ | +++ | +++ |  | NG | +++ |

[Supplementary Notes]

The present disclosure also discloses the following invention of technical ideas that can be understood from the aforementioned embodiment.

(Supplementary Note 1)

An electromagnetic wave shielding sheet before thermal pressing for forming an electromagnetic wave shielding layer used for an electronic component-mounting substrate comprising:
- a substrate;
- an electronic component mounted on one or both surfaces of the substrate; and
- an electromagnetic wave shielding layer that covers a step part formed by mounting the electronic component and at least a part of an exposed surface of the substrate, wherein
- the electromagnetic wave shielding sheet includes a magnetic layer including a binder resin and an electromagnetic wave absorption filler, and
- the Young's modulus of the magnetic layer at 23° C. is 10 to 700 MPa.

(Supplementary Note 2)

The electromagnetic wave shielding sheet according to Supplementary Note 1, wherein the Young's modulus of the magnetic layer at 80° C. is 5 to 85 MPa.

(Supplementary Note 3)

The electromagnetic wave shielding sheet according to Supplementary Note 1 or 2, wherein the glass transition temperature of the magnetic layer is −15° C. to 30° C. and the glass transition temperature after the magnetic layer is heated for two hours at 180° C. is 20 to 80° C.

(Supplementary Note 4)

The electromagnetic wave shielding sheet according to any one of Supplementary Notes 1 to 3, wherein the ratio [Young's modulus at 23° C.]/[Young's modulus at 80° C.] of the Young's modulus of the magnetic layer at 23° C. to the Young's modulus of the conductive layer at 80° C. is 3.2 to 8.5.

(Supplementary Note 5)

The electromagnetic wave shielding sheet according to any one of Supplementary Notes 1 to 4, wherein the curing degree of the magnetic layer is 60 to 99%.

(Supplementary Note 6)

An electromagnetic wave shielding sheet before thermal pressing for forming an electromagnetic wave shielding layer for covering electronic components comprising an electromagnetic wave shielding layer that covers an exposed surface including at least a part of step parts formed by arranging a plurality of electronic components on a placement table and includes at least one of an electromagnetic wave reflection layer and an electromagnetic wave absorption layer, wherein
- the electromagnetic wave shielding sheet comprises a conductive layer before thermal pressing of the electromagnetic wave reflection layer and at least one of a conductive layer and a magnetic layer before thermal pressing of the electromagnetic wave absorption layer,
- the conductive layer before thermal pressing of the electromagnetic wave reflection layer comprises a binder resin and a conductive filler,
- the conductive layer or the magnetic layer before thermal pressing of the electromagnetic wave absorption layer comprises a binder resin and an electromagnetic wave absorption filler,
- the Young's modulus of the conductive layer at 23° C. is 10 to 700 MPa, and
- the Young's modulus of the magnetic layer at 23° C. is 10 to 700 MPa.

(Supplementary Note 7)

The electromagnetic wave shielding sheet according to Supplementary Note 6, wherein
- the Young's modulus of the conductive layer at 80° C. is 5 to 85 MPa, and
- the Young's modulus of the magnetic layer at 80° C. is 5 to 85 MPa.

(Supplementary Note 8)

The electromagnetic wave shielding sheet according to Supplementary Note 6 or 7, wherein
- the glass transition temperature of the conductive layer is −15° C. to 30° C. and the glass transition temperature of the conductive layer after heating the conductive layer at 180° C. for two hours is 20 to 80° C., and
- the glass transition temperature of the magnetic layer is −15° C. to 30° C. and the glass transition temperature of the magnetic layer after the magnetic layer is heated at 180° C. for two hours is 20 to 80° C.

(Supplementary Note 9)

The electromagnetic wave shielding sheet according to any one of Supplementary Notes 6-8, wherein
- the ratio [Young's modulus at 23° C.]/[Young's modulus at 80° C.] of the Young's modulus of the conductive layer at 23° C. to the Young's modulus of the conductive layer at 80° C. is 3.2 to 8.5, and
- the ratio [Young's modulus at 23° C.]/[Young's modulus at 80° C.] of the Young's modulus of the magnetic layer at 23° C. to the Young's modulus of the magnetic layer at 80° C. is 3.2 to 8.5.

(Supplementary Note 10)

The electromagnetic wave shielding sheet according to any one of Supplementary Notes 6-9, wherein the curing degree of the conductive layer is 60 to 99% and the curing degree of the magnetic layer is 60 to 99%.

This application is based upon and claims the benefit of priority from Japanese Patent Application No. 2018-111856, filed on Jun. 12, 2018, the disclosure of which is incorporated herein in its entirety by reference.

Since the electromagnetic wave shielding sheet according to the present disclosure has excellent coverage for a concave/convex structure and excellent electromagnetic wave shielding properties, it is preferable as a covering sheet for electromagnetic wave shielding that covers a substrate on which electronic components are mounted. Further, the electromagnetic wave shielding sheet according to the present disclosure can also be applied to a substrate having a concave and convex shape on which components are not mounted.

The invention claimed is:

1. An electromagnetic wave shielding sheet before thermal pressing for forming an electromagnetic wave shielding layer, used for an electronic component-mounting substrate comprising a substrate, an electronic component mounted on one or both surfaces of the substrate, and an electromagnetic wave shielding layer that covers a step part formed by mounting the electronic component and at least a part of an exposed surface of the substrate and includes at least one of an electromagnetic wave reflection layer and an electromagnetic wave absorption layer, wherein:
the electromagnetic wave shielding sheet includes at least one of a conductive layer before thermal pressing of the electromagnetic wave reflection layer and a conductive layer before thermal pressing of the electromagnetic wave absorption layer;

the conductive layer before thermal pressing of the electromagnetic wave reflection layer comprises a binder resin and a conductive filler;

the conductive layer before thermal pressing of the electromagnetic wave absorption layer comprises a binder resin and an electromagnetic wave absorption filler; and a Young's modulus of the conductive layer at 23° C. is 10 to 700 MPa.

2. The electromagnetic wave shielding sheet according to claim 1, wherein the Young's modulus of the conductive layer at 80° C. is 5 to 85 MPa.

3. The electromagnetic wave shielding sheet according to claim 1, wherein a glass transition temperature of the conductive layer is −15° C. to 30° C., and a glass transition temperature of the conductive layer after the conductive layer is heated at 180° C. for two hours is 20 to 80° C.

4. The electromagnetic wave shielding sheet according to claim 1, wherein a ratio [Young's modulus at 23° C.]/[Young's modulus at 80° C.] of the Young's modulus of the conductive layer at 23° C. to the Young's modulus of the conductive layer at 80° C. is 1.8 to 8.5.

5. The electromagnetic wave shielding sheet according to claim 1, wherein a curing degree of the conductive layer is 60 to 99%.

* * * * *